(12) United States Patent
Chen et al.

(10) Patent No.: US 12,272,634 B2
(45) Date of Patent: Apr. 8, 2025

(54) SEMICONDUCTOR STRUCTURE HAVING AN ANCHOR-SHAPED BACKSIDE VIA

(71) Applicant: Taiwan Semiconductor Manufacturing Co., Ltd., Hsinchu (TW)

(72) Inventors: Chun-Yuan Chen, Hsinchu (TW); Huan-Chieh Su, Changhua County (TW); Cheng-Chi Chuang, New Taipei (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/301,757

(22) Filed: Apr. 17, 2023

(65) Prior Publication Data

US 2023/0260897 A1 Aug. 17, 2023

Related U.S. Application Data

(60) Continuation of application No. 17/582,314, filed on Jan. 24, 2022, now Pat. No. 11,631,638, which is a
(Continued)

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76897* (2013.01); *H01L 21/823418* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 8,772,109 B2 7/2014 Colinge
8,785,285 B2 7/2014 Tsai et al.
(Continued)

OTHER PUBLICATIONS

Lou, Qiaowei, et al., "Optical Emission Spectroscopic Studies and Comparisons of CH3F/CO2 and CH3F/O2 Inductively Coupled Plasmas", Plasma Processing Laboratory, Department of Chemical and Biomolecular Engineering, University of Houston, Manuscript # JVSTA-A-14-332.
(Continued)

*Primary Examiner* — Younes Boulghassoul
(74) *Attorney, Agent, or Firm* — HAYNES AND BOONE, LLP

(57) ABSTRACT

A semiconductor structure includes a source/drain (S/D) region, one or more dielectric layers over the S/D region, one or more semiconductor channel layers connected to the S/D region, an isolation structure under the S/D region and the one or more semiconductor channel layers, and a via under the S/D region and electrically connected to the S/D region. A lower portion of the via is surrounded by the isolation structure and an upper portion of the via extends vertically between the S/D region and the isolation structure.

20 Claims, 16 Drawing Sheets

Related U.S. Application Data division of application No. 16/926,447, filed on Jul. 10, 2020, now Pat. No. 11,233,005.

(51) Int. Cl.
| | |
|---|---|
| *H01L 21/8234* | (2006.01) |
| *H01L 23/528* | (2006.01) |
| *H01L 27/088* | (2006.01) |
| *H01L 29/06* | (2006.01) |
| *H01L 29/417* | (2006.01) |
| *H01L 29/423* | (2006.01) |
| *H01L 29/66* | (2006.01) |
| *H01L 29/78* | (2006.01) |
| *H01L 29/786* | (2006.01) |

(52) U.S. Cl.
CPC ........ *H01L 21/823431* (2013.01); *H01L 21/823475* (2013.01); *H01L 21/823481* (2013.01); *H01L 23/5283* (2013.01); *H01L 23/5286* (2013.01); *H01L 27/0886* (2013.01); *H01L 29/0653* (2013.01); *H01L 29/4175* (2013.01); *H01L 29/41766* (2013.01); *H01L 29/41791* (2013.01); *H01L 29/42392* (2013.01); *H01L 29/66795* (2013.01); *H01L 29/785* (2013.01); *H01L 29/78696* (2013.01)

(58) Field of Classification Search
CPC .......... H01L 27/1211; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 29/41725–41791; H01L 23/49827; H01L 23/481; H01L 23/5384; H01L 21/76898; H01L 21/486; H01L 29/4175; H01L 23/5226; H01L 23/5283; H01L 23/5286; H01L 21/823475; H01L 21/823871; H01L 21/76897; H10B 12/36; H10B 12/056

See application file for complete search history.

(56) References Cited

U.S. PATENT DOCUMENTS

| | | | |
|---|---|---|---|
| 8,802,504 B1 | 8/2014 | Hou et al. | |
| 8,803,292 B2 | 8/2014 | Chen et al. | |
| 8,803,316 B2 | 8/2014 | Lin et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 8,993,380 B2 | 3/2015 | Hou et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 9,520,482 B1 | 12/2016 | Chang et al. | |
| 9,576,814 B2 | 2/2017 | Wu et al. | |
| 9,704,835 B2 | 7/2017 | Feng et al. | |
| 9,711,555 B2 | 7/2017 | Lin et al. | |
| 9,818,872 B2 | 11/2017 | Ching et al. | |
| 9,887,269 B2 | 2/2018 | Ching et al. | |
| 9,899,398 B1 | 2/2018 | Colinge et al. | |
| 10,020,261 B2 | 7/2018 | Wu et al. | |
| 10,032,627 B2 | 7/2018 | Lee et al. | |
| 10,109,721 B2 | 10/2018 | Lin et al. | |
| 10,157,799 B2 | 12/2018 | Ching et al. | |
| 10,199,502 B2 | 2/2019 | Huang et al. | |
| 10,269,715 B2 | 4/2019 | Wu et al. | |
| 10,282,504 B2 | 5/2019 | Wu et al. | |
| 11,631,638 B2 * | 4/2023 | Chen | H01L 29/785 257/401 |
| 2018/0175036 A1 | 6/2018 | Ching et al. | |
| 2020/0258778 A1 | 8/2020 | Lilak | |
| 2020/0303509 A1 * | 9/2020 | Mehandru | H01L 29/4175 |
| 2020/0373301 A1 * | 11/2020 | Kim | H01L 29/0847 |
| 2021/0134721 A1 | 5/2021 | Chiang | |
| 2021/0233834 A1 | 7/2021 | Chen | |
| 2021/0305130 A1 | 9/2021 | Cho | |
| 2021/0336004 A1 * | 10/2021 | Huang | H01L 23/5286 |
| 2021/0336019 A1 * | 10/2021 | Su | H01L 29/41725 |
| 2021/0351079 A1 * | 11/2021 | Su | H01L 29/785 |
| 2021/0375722 A1 | 12/2021 | Kim | |
| 2021/0376094 A1 * | 12/2021 | Lin | H01L 29/42392 |
| 2021/0376155 A1 * | 12/2021 | Chang | H01L 29/78696 |
| 2021/0408246 A1 * | 12/2021 | Ganguly | H01L 21/02532 |
| 2021/0408249 A1 * | 12/2021 | Yu | H01L 29/66545 |

OTHER PUBLICATIONS

Michallet, Jean-Eric, et al. "CoolCube: A True 3DVLSI Alternative to Scaling", Mar. 24, 2015, 3DInCities. https://www.3dincites.com/2015/03/coolcube-a-true-3dvlsi-alternative-to-scaling/.

Chen, Hsin-Ping, et al., "Semiconductor Device with Conductors Embedded in a Substrate", U.S. Appl. No. 16/752,158, filed Jan. 24, 2020, Assignee: Taiwan Semiconductor Manufacturing Co., Ltd., 29 pages specification, 19 pages drawings.

Chen, Chun-Yuan, et al., "Semiconductor Devices with Backside Air Gap Dielectric", U.S. Appl. No. 16/888,217, filed May 29, 2020, Assignee: Taiwan Semiconductor Manufacturing Co., Ltd., 27 pages specification, 16 pages drawings.

Su, Huan-Chieh, et al., "Backside Power Rail and Methods of Forming the Same", U.S. Appl. No. 16/901,963, filed Jun. 15, 2020, Assignee: Taiwan Semiconductor Manufacturing Co., Ltd., 29 pages specification, 22 pages drawings.

* cited by examiner

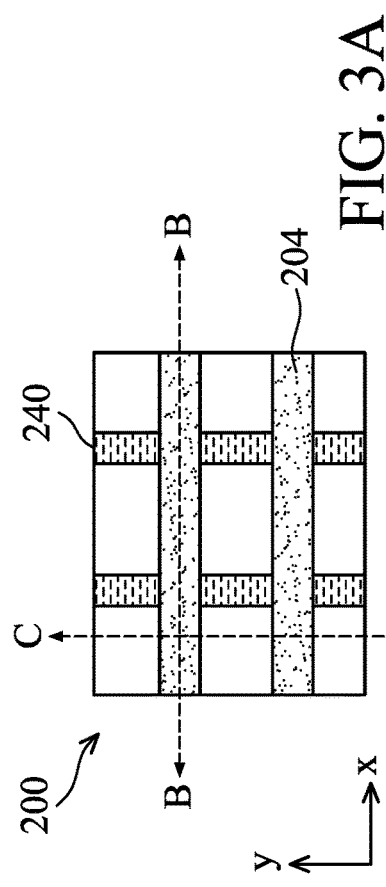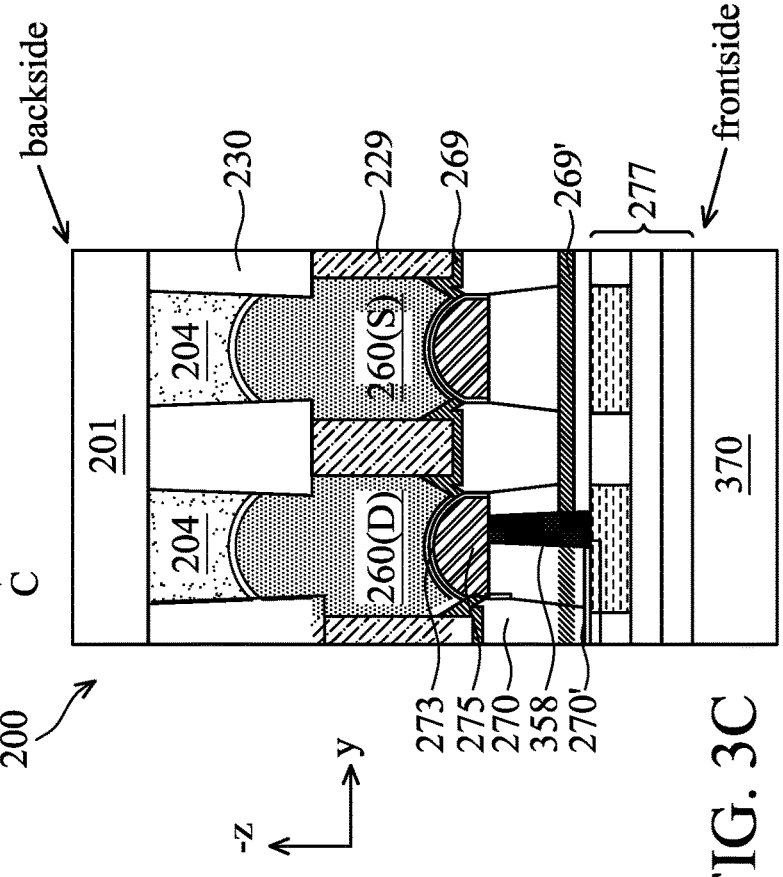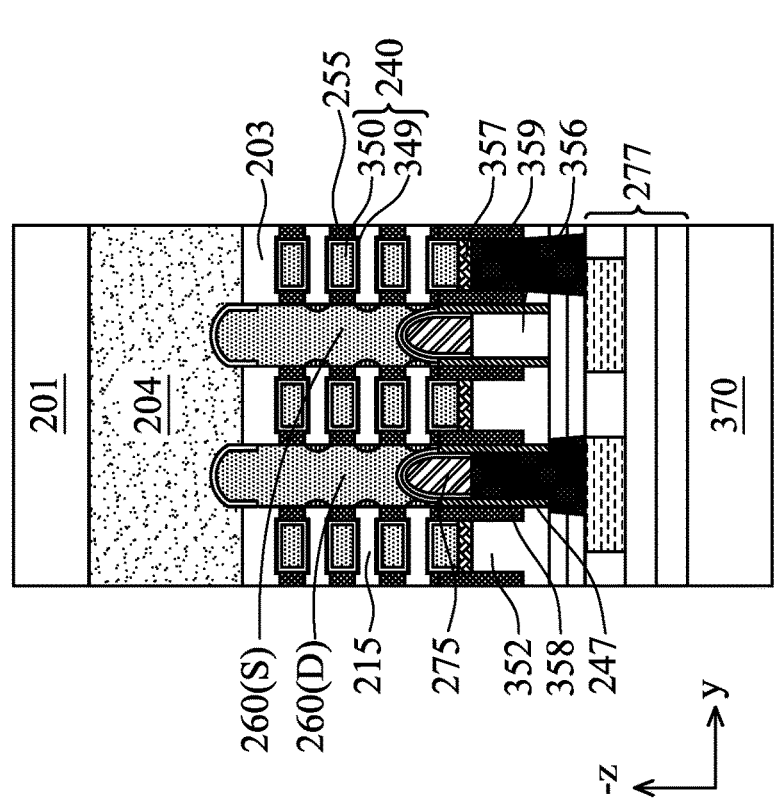
FIG. 3A
FIG. 3B
FIG. 3C

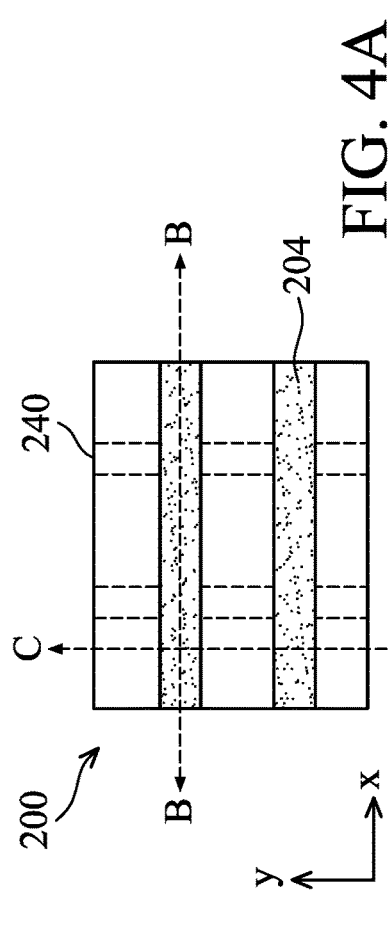
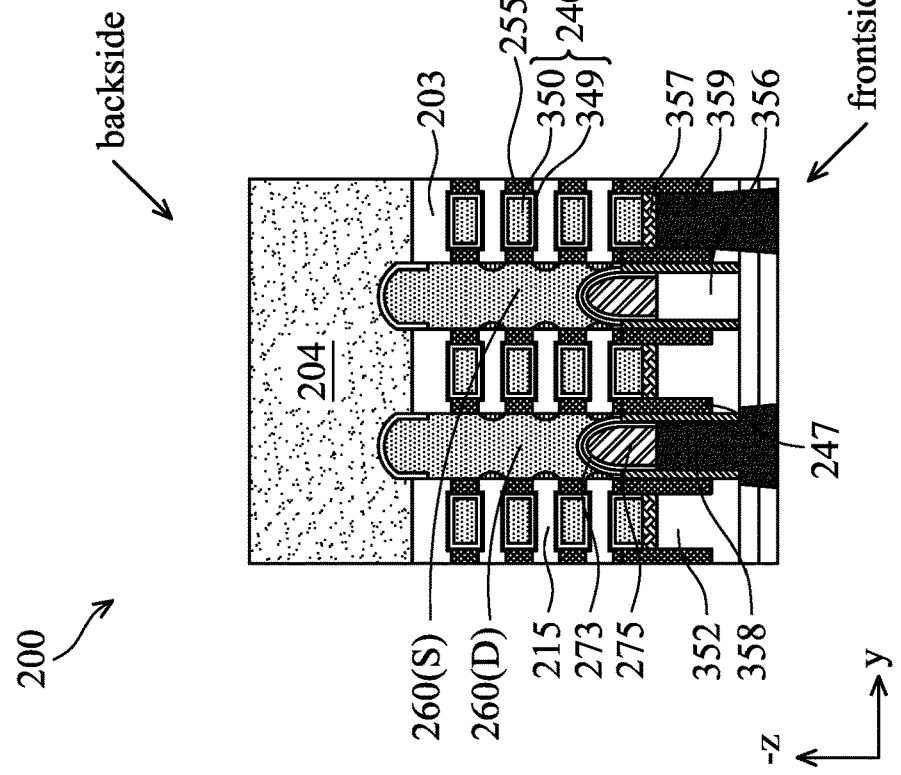
FIG. 4A
FIG. 4B
FIG. 4C

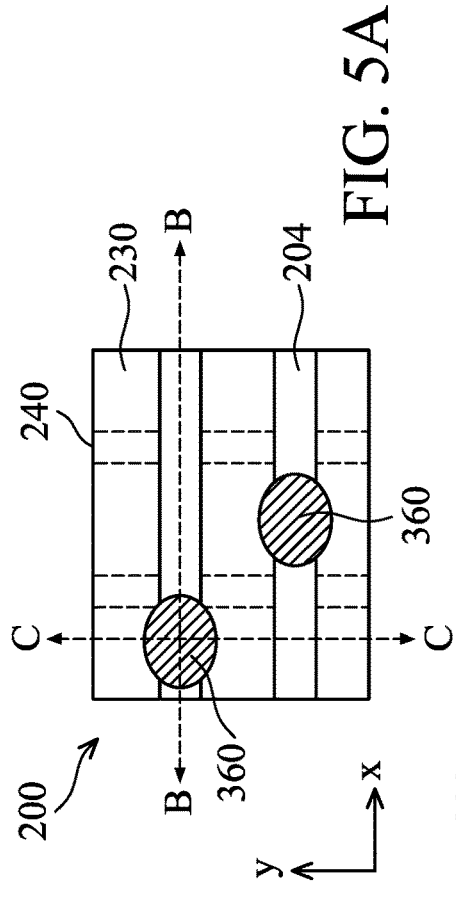
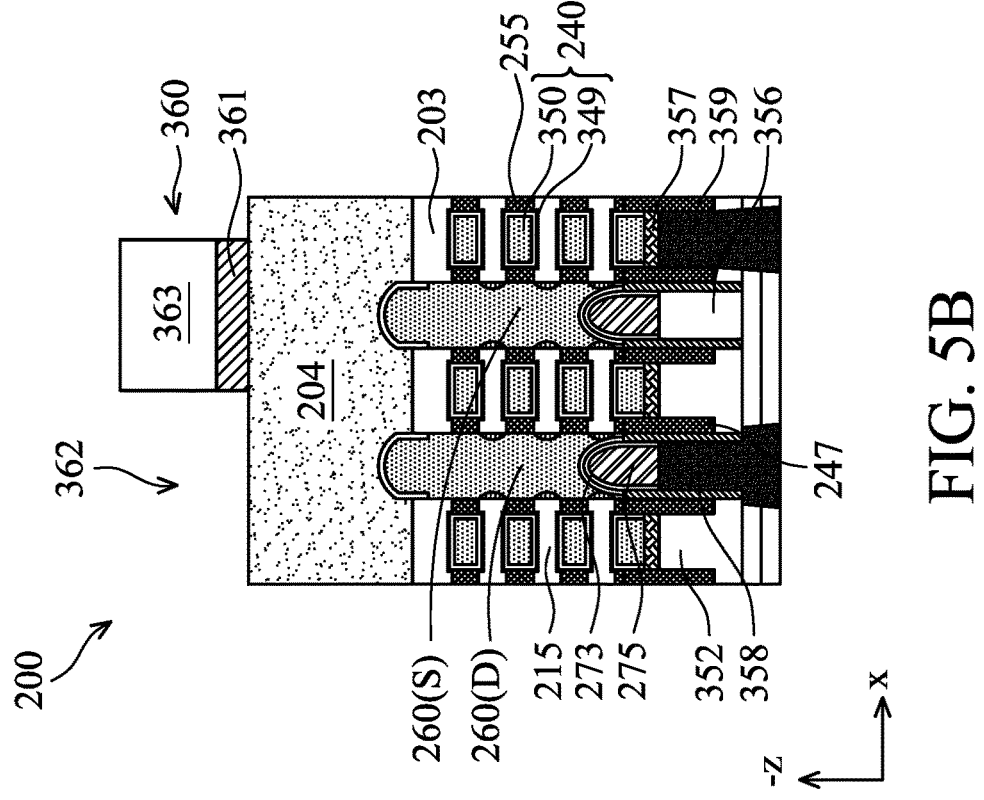
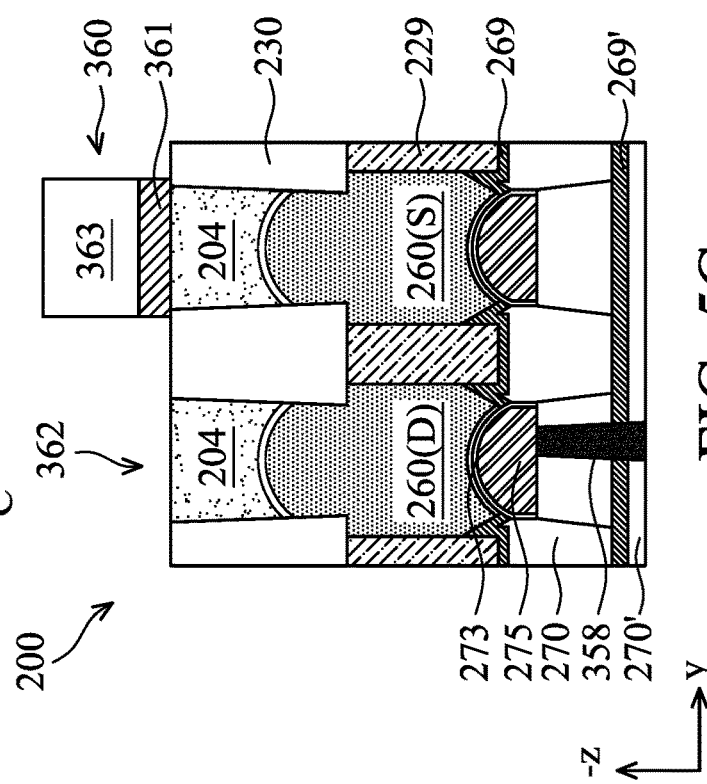
FIG. 5A
FIG. 5B
FIG. 5C

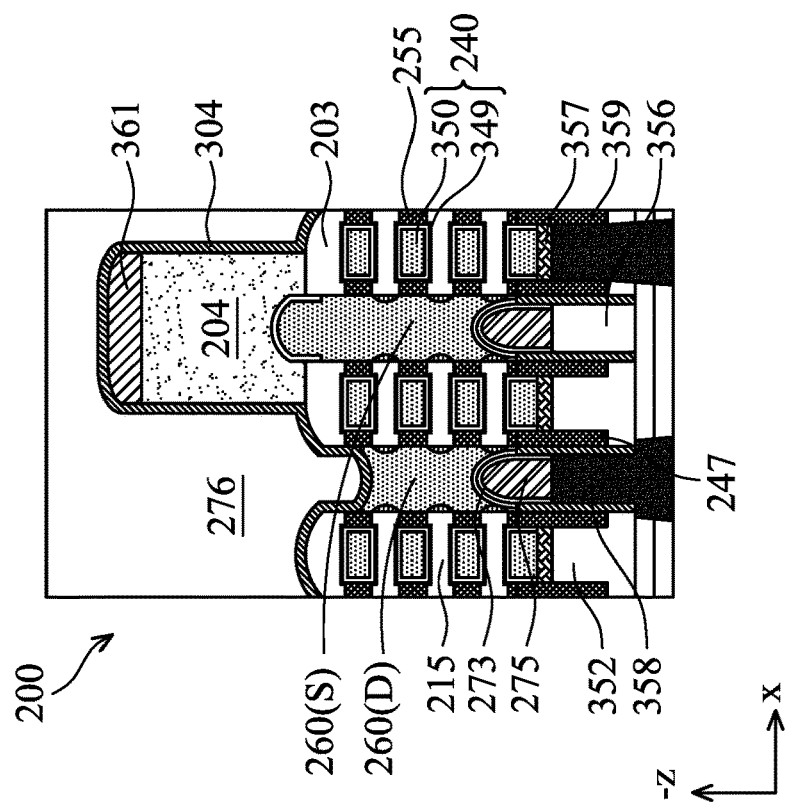
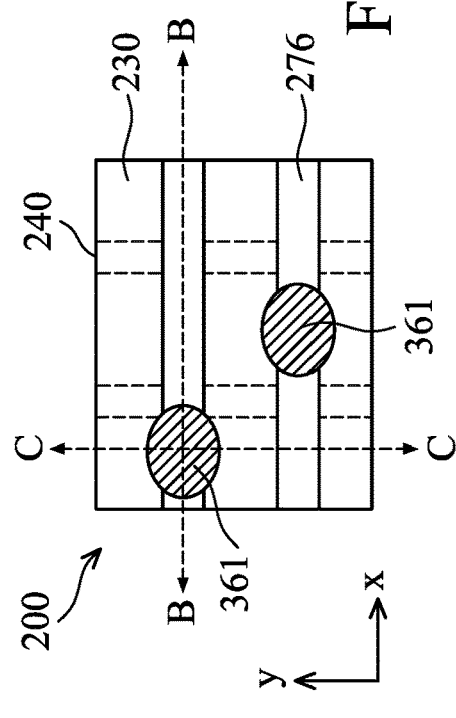
FIG. 7A
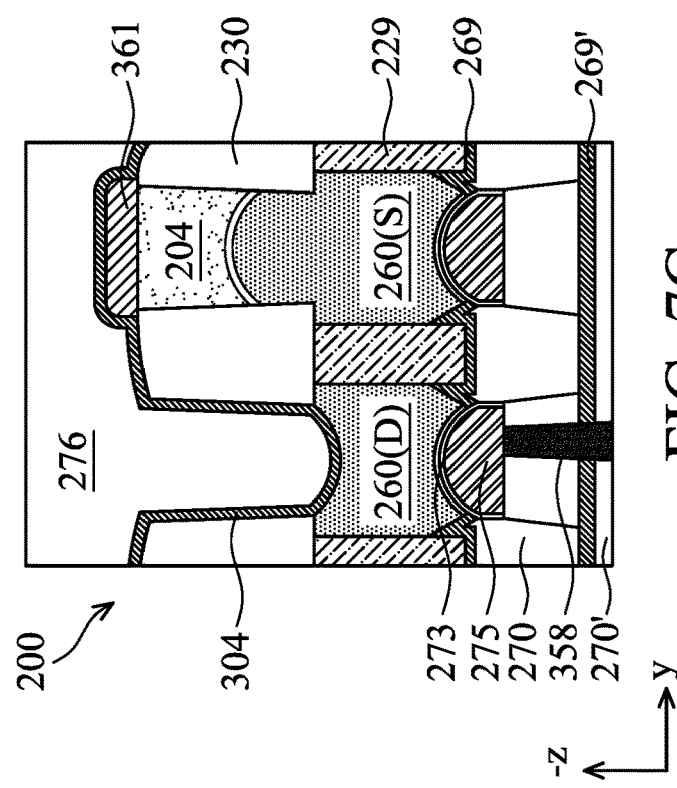
FIG. 7B
FIG. 7C

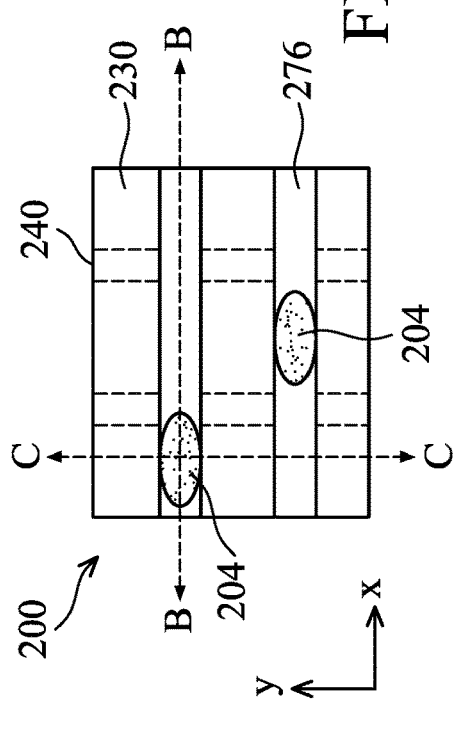
FIG. 8A
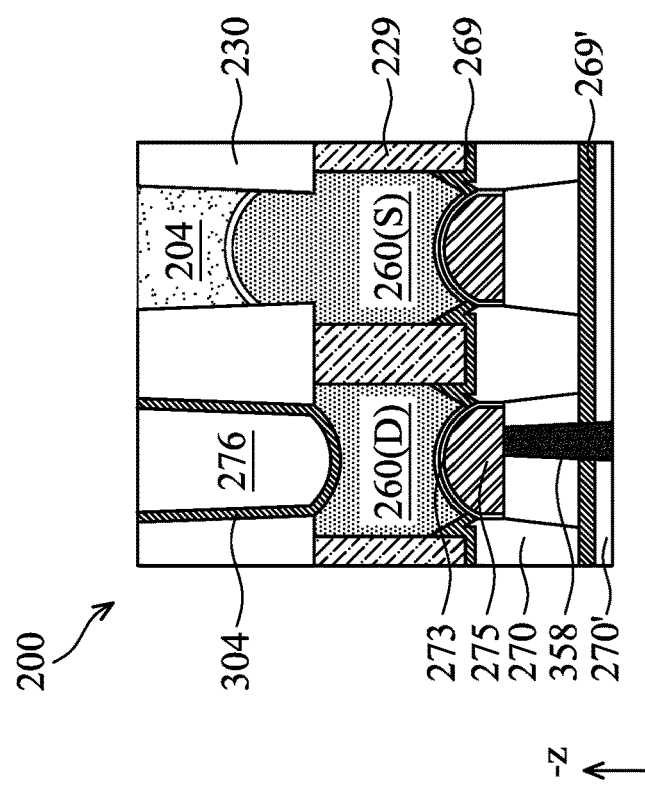
FIG. 8B
FIG. 8C

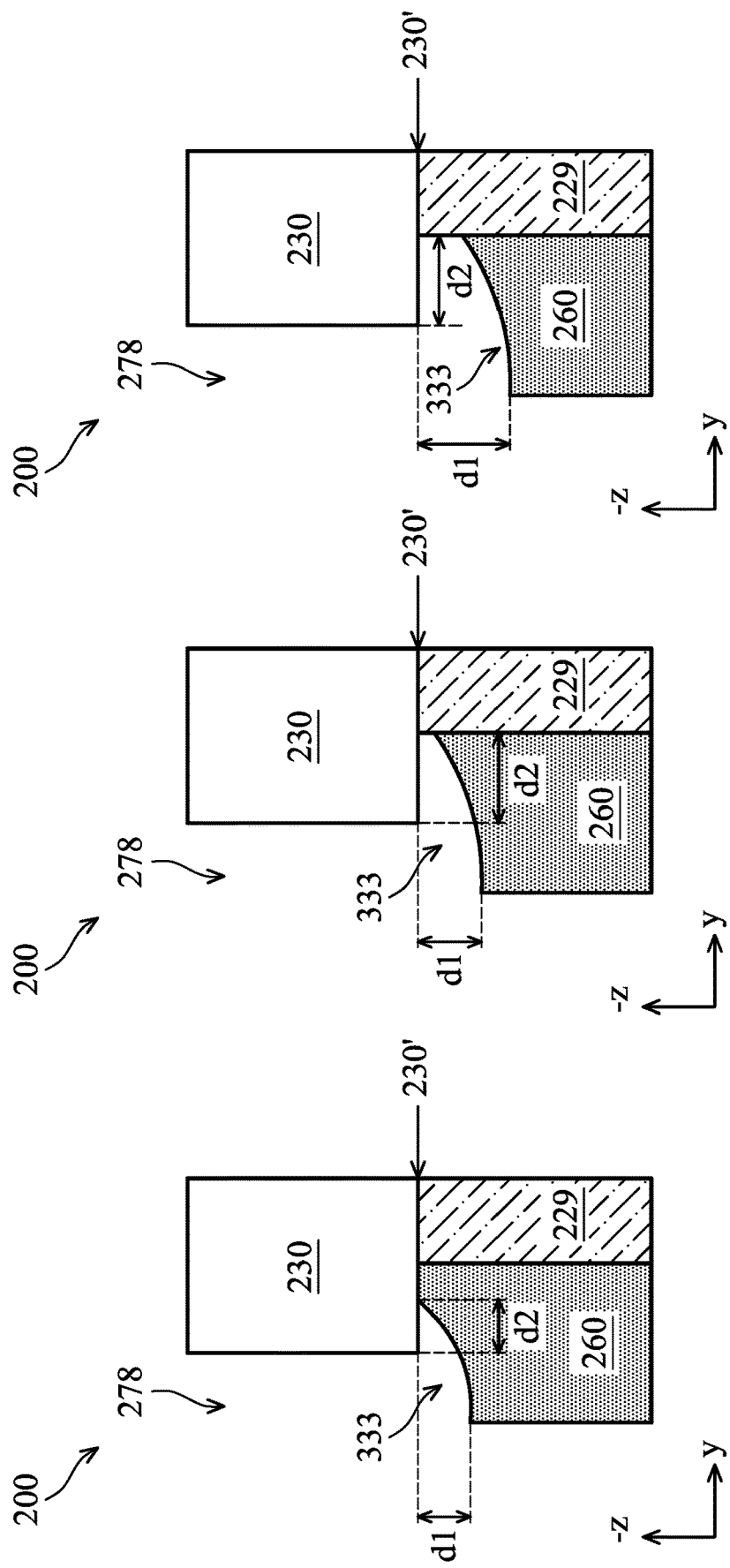

they have not been entirely satisfactory in all respects. One area of interest is how to form power rails and vias on the backside of an IC with reduced resistance.

SEMICONDUCTOR STRUCTURE HAVING AN ANCHOR-SHAPED BACKSIDE VIA

PRIORITY

This is a continuation of U.S. patent application Ser. No. 17/582,314 filed Jan. 24, 2022, which is a divisional of U.S. patent application Ser. No. 16/926,447 filed Jul. 10, 2020. The entire disclosure of both applications is incorporated herein by reference.

BACKGROUND

Conventionally, integrated circuits (IC) are built in a stacked-up fashion, having transistors at the lowest level and interconnect (vias and wires) on top of the transistors to provide connectivity to the transistors. Power rails (such as metal lines for voltage sources and ground planes) are also above the transistors and may be part of the interconnect. As the integrated circuits continue to scale down, so do the power rails. This inevitably leads to increased voltage drop across the power rails, as well as increased power consumption of the integrated circuits. Therefore, although existing approaches in semiconductor fabrication have been generally adequate for their intended purposes, they have not been entirely satisfactory in all respects. One area of interest is how to form power rails and vias on the backside of an IC with reduced resistance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, 7A, 8A, 9A, 10A, and 11A illustrate top views of a portion of a semiconductor device, according to some embodiments.

FIGS. 2B, 3B, 4B, 5B, 6B, 7B, 8B, 9B, 10B, and 11B illustrate cross-sectional views of a portion of the semiconductor device along the B-B line in FIGS. 2A, 3A, 4A, 5A, 6A, 7A, 8A, 9A, 10A, and 11A, respectively, according to some embodiments.

FIGS. 2C, 4C, 5C, 6C, 7C, 8C, 9C, 10C, and 11C illustrate cross-sectional views of a portion of the semiconductor device along the C-C line in FIGS. 2A, 4A, 5A, 6A, 7A, 8A, 9A, 10A, and 11A, respectively, according to some embodiments.

FIGS. 9C-1, 9C-2, and 9C-3 illustrate a blown-up view of a portion of the semiconductor device in FIG. 9C, according to some embodiments.

FIGS. 10C-1, 10C-2, 10C-3, and 10C-4 illustrate a blown-up view of a portion of the semiconductor device in FIG. 10C, according to some embodiments.

DETAILED DESCRIPTION

Figure 1A:
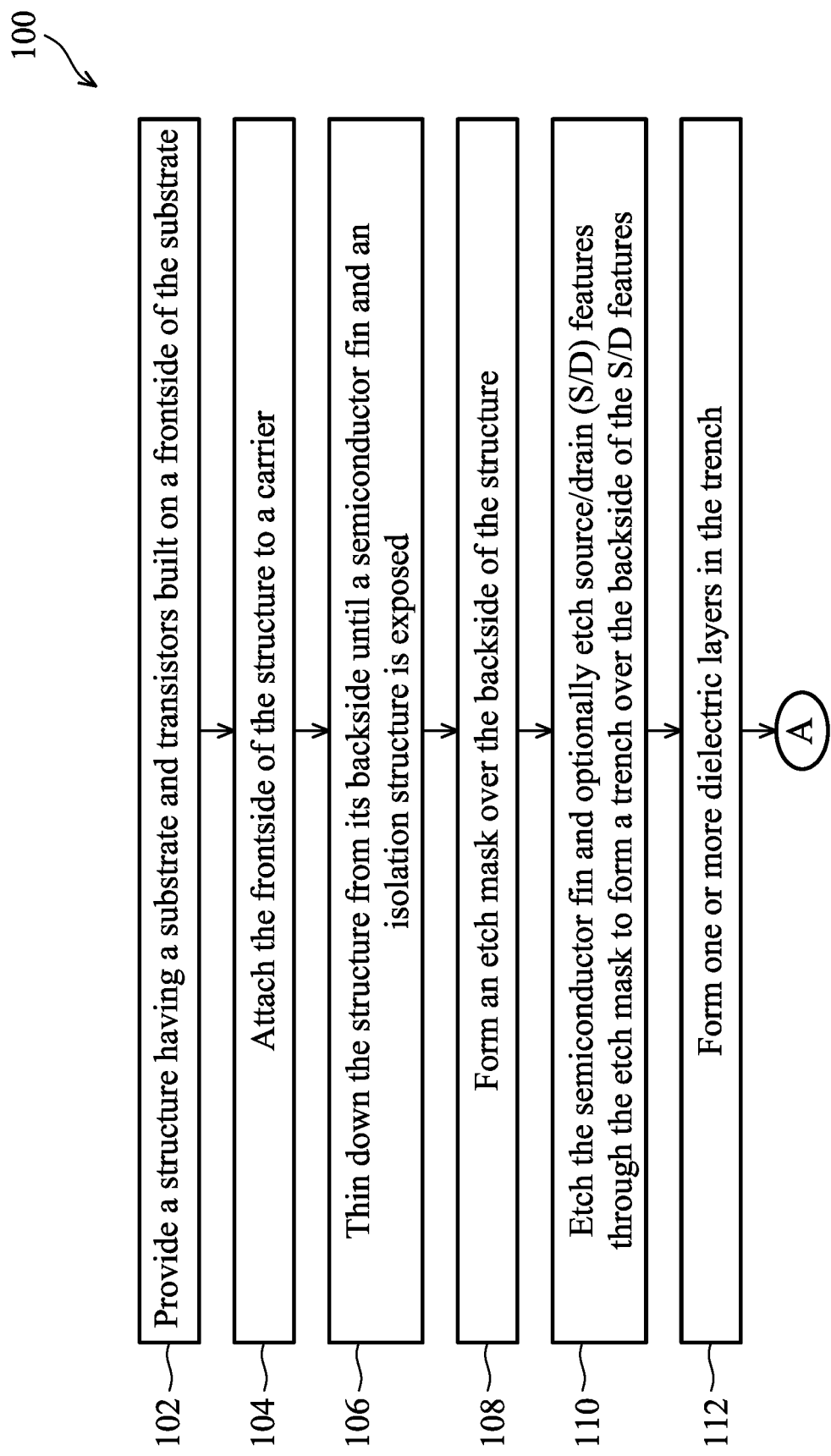
FIGS. 1A and 1B show a flow chart of a method of forming a semiconductor device with backside power rails and backside vias, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to semiconductor devices with backside power rails and backside vias. As discussed above, power rails in IC need further improvement in order to provide the needed performance boost as well as reducing power consumption. An object of the present disclosure includes providing power rails (or power routings) on a back side (or backside) of a structure containing transistors (such as gate-all-around (GAA) transistors and/or FinFET transistors) in addition to an interconnect structure (which may include power rails as well) on a front side (or frontside) of the structure. This increases the number of metal tracks available in the structure for directly connecting to source/drain contacts and vias. It also increases the gate density for greater device integration than existing structures without the backside power rails. The backside power rails may have wider dimension than the first level metal (M0) tracks on the frontside of the structure, which beneficially reduces the power rail resistance. The present disclosure also provides a backside via structure for connecting the backside power rails to S/D features on the frontside. The backside via structure has a shape resembling a boat anchor. So, it is called an anchor-shaped via in the present disclosure. The anchor-shaped via extends into space vertically between a S/D feature and isolation structure, thereby increasing the interfacial area between the via and the S/D feature and reducing the resistance between the S/D feature and the backside power rails. The details of the structure and fabrication methods of the present disclosure are described below in conjunction with the accompanied drawings, which illustrate a process of making a GAA device, according to some embodiments. A GAA device refers to a device having vertically-stacked horizontallyoriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. The present disclosure can also be utilized to make FinFET devices having backside power rail and backside self-aligned vias. For the purposes of simplicity, the present disclosure uses GAA devices as an example, and points out certain differences in the processes between GAA and FinFET embodiments. Those of ordinary skill in the art should appreciate that they may readily use the present disclosure as a basis for designing or modifying other processes and structures for carrying out the same purposes and/or achieving the same advantages of the embodiments introduced herein.

Figure 1B:
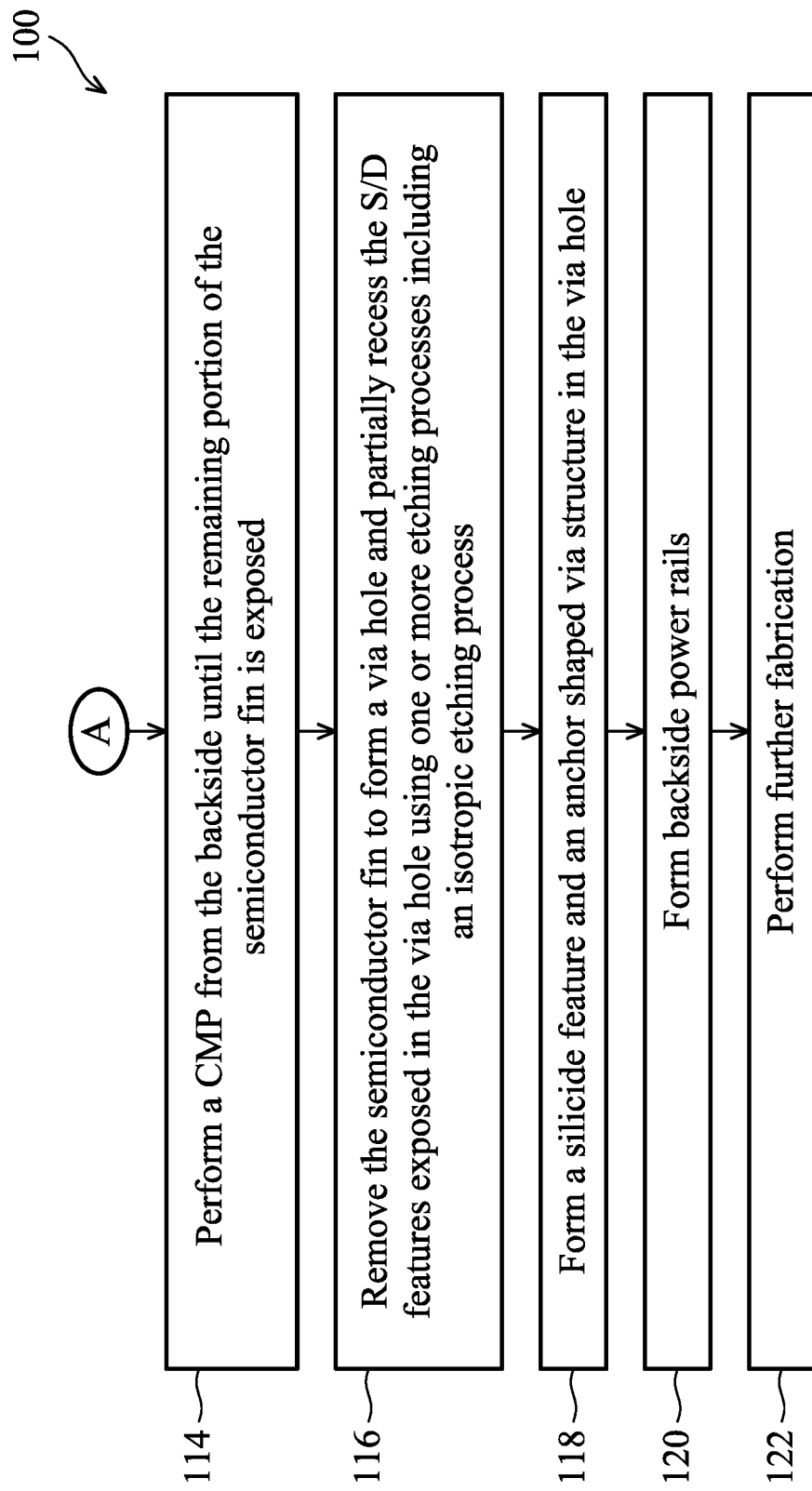

FIGS. 1A and 1B are a flow chart of a method 100 for fabricating a semiconductor device according to various aspects of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 2A through FIG. 11C that illustrate various top, cross-sectional, and perspective views of a semiconductor device (or a semiconductor structure) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2A through 13E have been simplified for the sake of clarity to better understand the inventive concepts of the present disclosure. Additional features can be added in the device 200, and some of the features described below can be replaced, modified, or eliminated in other embodiments of the device 200.

Figure 2A:
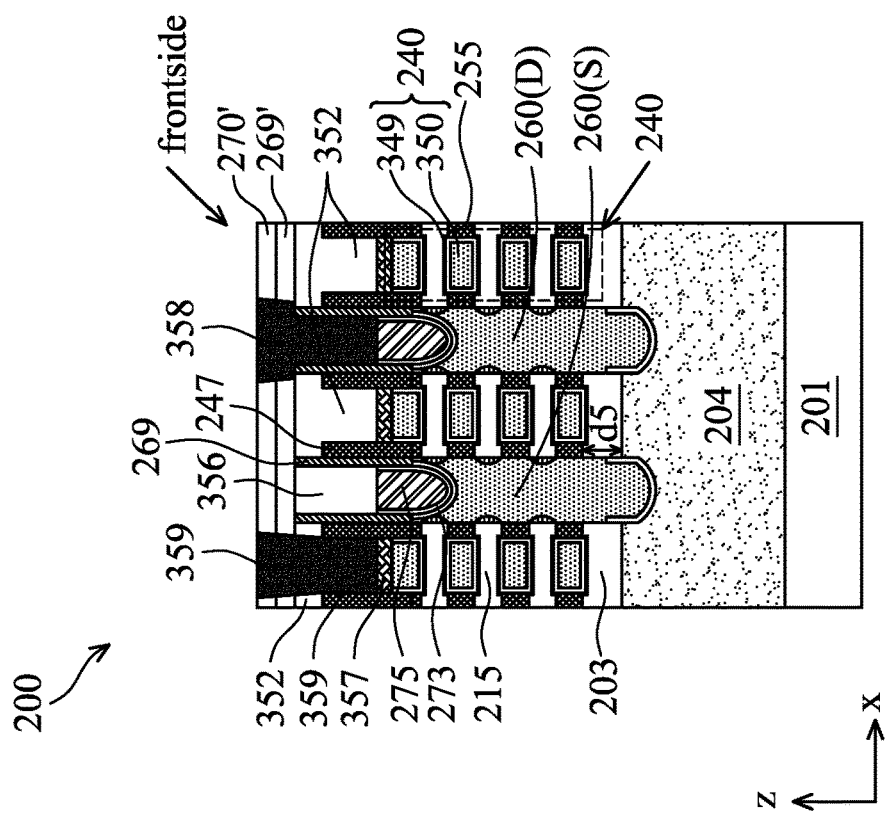
Figure 2B:
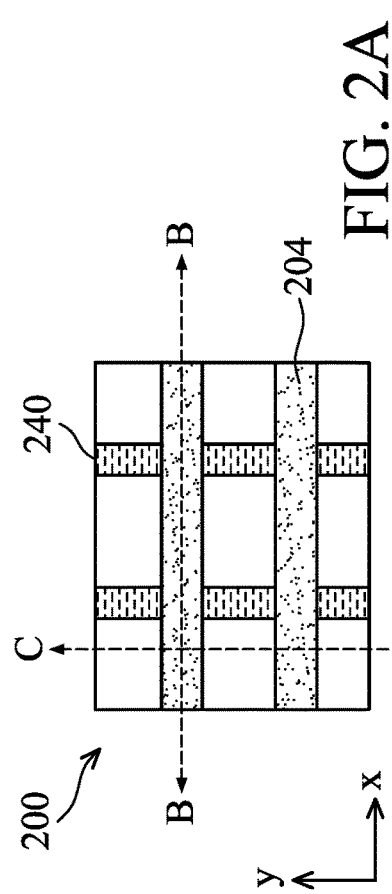
Figure 2C:
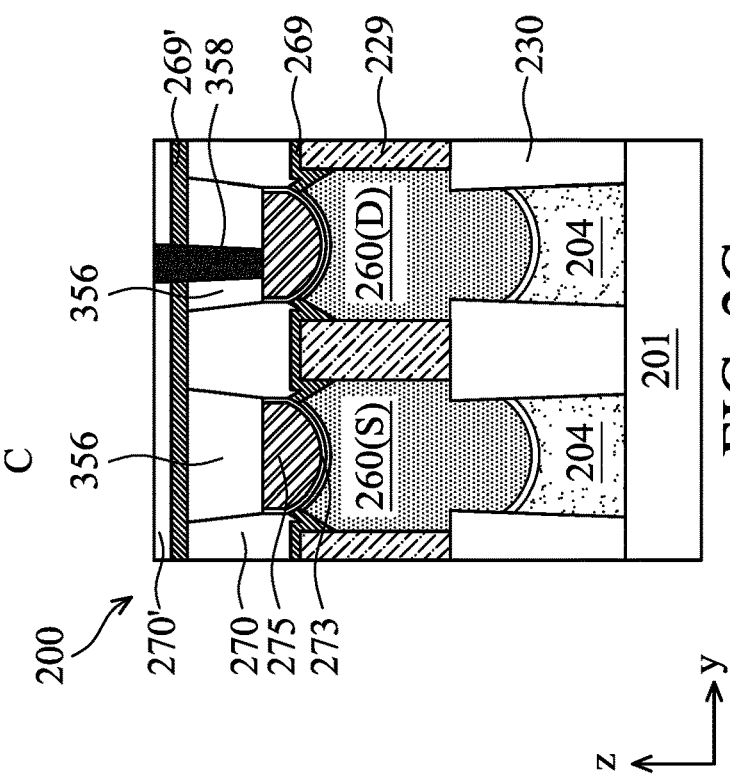

At operation 102, the method 100 (FIG. 1A) provides semiconductor device 200 having a substrate 201 and transistors built on a frontside of the substrate 201. FIG. 2A illustrates a top view of the device 200, and FIGS. 2B and 2C illustrate cross-sectional views of the device 200, in portion, along the B-B line and the C-C line in FIG. 2A, respectively. Particularly, the B-B line is cut along the lengthwise direction of a semiconductor fin 204 (direction "X") and the C-C line is cut into the source/drain regions of the transistors and is parallel to the lengthwise direction of gate stacks 240 (direction "Y"). The lengthwise directions of the gate stacks 240 and the semiconductor fins 204 are perpendicular to each other. The B-B lines and C-C lines in FIGS. 3A through 11A are similarly configured.

Referring to FIGS. 2A-2C, the semiconductor device 200 includes the substrate 201 and various elements built on the front surface of the substrate 201. In the depicted embodiment, the semiconductor device 200 includes isolation features 230 (or isolation structure 230) over the substrate 201, semiconductor fins 204 extending from the substrate 201 and adjacent to the isolation features 230, and source/drain (S/D) features 260 over the semiconductor fins 204 in the S/D regions. The semiconductor device 200 further includes dielectric fins 229 over the isolation features 230 and running parallel to the semiconductor fins 204. The sidewalls of the S/D features 260 are confined by adjacent dielectric fins 229. The semiconductor device 200 further includes one or more channel semiconductor layers 215 suspended over the semiconductor fins 204 and connecting the S/D features 260 along the "X" direction, gate stacks 240 between the S/D features 260 and wrapping around each of the channel layers 215, and a bottom dielectric capping (or blocking) layer 203 disposed between the semiconductor fins 204 and both the channel layers 215 and the gate stacks 240. The semiconductor device 200 further includes inner spacers 255 between the S/D features 260 and the gate stack 240, a (outer) gate spacer 247 over sidewalls of the gate stack 240 and over the topmost channel layer 215, a contact etch stop layer (CESL) 269 adjacent to the gate spacer 247 and over the epitaxial S/D features 260 and the isolation features 230, an inter-layer dielectric (ILD) layer 270 over the CESL 269, another CESL 269' over the ILD 270, and another ILD 270' over the CESL 269'. Over the gate stack 240, the semiconductor device 200 further includes a self-aligned capping layer 352. In some implementations (like depicted in FIG. 2B), a glue layer 357 may be deposited over the gate stacks 240 and to improve adhesion between the gate stacks 240 and the gate vias 359 and to reduce contact resistance thereof. Over the S/D features 260, the semiconductor device 200 further includes silicide features 273, S/D contacts 275, dielectric S/D capping layer 356, and S/D contact via 358. In the depicted embodiment, the dielectric S/D capping layer 356 is disposed over the source feature 260 (labeled as "260(S)" in FIGS. 2B-2C), and the S/D contact via 358 is disposed over the drain feature 260 (labeled as "260(D)" in FIGS. 2B-2C). In alternative embodiments, the S/D capping layer 356 may be disposed over the drain feature 260, and the S/D contact via 358 may be disposed over the source feature 260. In some embodiments, the S/D capping layer 356 may be disposed over both the source and the drain features 260. In some embodiments the S/D contact vias 358 may be disposed over both the source and the drain features 260. In an embodiment where the device 200 is a FinFET device, the channel layers 215 are merged into one channel layer (a semiconductor fin channel), and the inner spacers 255 are omitted. Further, in such FinFET embodiment, the gate stack 240 engages top and sidewalls of the semiconductor fin channel, and in the cross-sectional view of FIG. 2B, the gate stack 240 would be on top of the semiconductor fin channel only.

Referring to FIGS. 3A, 3B, and 3C, in which the semiconductor device 200 is flipped upside down, the semiconductor device 200 further includes one or more interconnect layers (denoted with 277) with wires and vias embedded in dielectric layers. The one or more interconnect layers connecting gate, source, and drain electrodes of various transistors, as well as other circuits in the device 200, to form an integrated circuit in part or in whole. The semiconductor device 200 may further include passivation layers, adhesion layers, and/or other layers built on the frontside of the semiconductor device 200. These layers and the one or more interconnect layers are collectively denoted with the label 277. The various elements of the semiconductor device 200 are further described below.

In an embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In an alternative embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate.

In various embodiments, the semiconductor fins 204 may include silicon, silicon germanium, germanium, or other suitable semiconductor, and may be undoped, unintentionally doped, or slightly doped with n-type or p-type dopants. The fins 204 may be patterned by any suitable method. For example, the fins 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 204. For example, the masking element may be used for etching recesses into semiconductor layers over or in the substrate 201, leaving the fins 204 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 204 may be suitable.

The isolation features 230 may include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures and/or deep trench isolation (DTI) structures. In an embodiment, the isolation features 230 can be formed by filling the trenches between fins 204 with insulator material (for example, by using a CVD process or a spin-on glass process), performing a chemical mechanical polishing (CMP) process to remove excessive insulator material and/or planarize a top surface of the insulator material layer, and etching back the insulator material layer to form isolation features 230. In some embodiments, isolation features 230 include a multi-layer structure, such as a silicon nitride layer disposed over a thermal oxide liner layer.

The dielectric fins 229 may include multiple layers of dielectric materials. For example, each dielectric fin 229 may include a dielectric liner as an outer layer and a dielectric fill layer as an inner layer. For example, the dielectric liner includes a low-k dielectric material such as a dielectric material including Si, O, N, and C. Exemplary low-k dielectric materials include fluoride-doped silica glass (FSG), carbon doped silicon oxide, Black Diamond® (Applied Materials of Santa Clara, California), Xerogel, Aerogel, amorphous fluorinated carbon, Parylene, BCB, SILK (Dow Chemical, Midland, Michigan), polyimide, or combinations thereof. Low-k dielectric material generally refers to dielectric materials having a low dielectric constant, for example, lower than that of silicon oxide ($k \approx 3.9$). The dielectric liner may be deposited using CVD, PVD, ALD, HDPCVD, MOCVD, RPCVD, PECVD, LPCVD, ALCVD, APCVD, other suitable methods, or combinations thereof. For example, the dielectric fill layer includes silicon oxide, silicon nitride, silicon oxynitride, TEOS formed oxide, PSG, BPSG, low-k dielectric material, other suitable dielectric material, or combinations thereof. The dielectric fill layer may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer may be deposited using other types of methods. In some embodiments, the dielectric fins 229 may further include a high-k helmet layer disposed over both the dielectric liner and the dielectric fill layer. In this way, the dielectric fill layer is fully surrounded by the dielectric liner at bottom and sidewalls and by the high-k helmet layer at top.

The S/D features 260 include epitaxially grown semiconductor materials such as epitaxially grown silicon, germanium, or silicon germanium. The S/D features 260 can be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof. The S/D features 260 may be doped with n-type dopants and/or p-type dopants. In some embodiments, for n-type transistors, the S/D features 260 include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors, the S/D features 260 include silicon germanium or germanium, and can be doped with boron, other p-type dopant, or combinations thereof (for example, forming Si:Ge:B epitaxial S/D features). The S/D features 260 may include multiple epitaxial semiconductor layers having different levels of dopant density. In some embodiments, annealing processes (e.g., rapid thermal annealing (RTA) and/or laser annealing) are performed to activate dopants in the epitaxial S/D features 260.

In embodiments, the channel layers 215 includes a semiconductor material suitable for transistor channels, such as silicon, silicon germanium, or other semiconductor material(s). The channel layers 215 may be in the shape of rods, bars, sheets, or other shapes in various embodiments. In an embodiment, the channel layers 215 are initially part of a stack of semiconductor layers that include the channel layers 215 and other (sacrificial) semiconductor layers alternately stacked layer-by-layer. The sacrificial semiconductor layers and the channel layers 215 include different material compositions (such as different semiconductor materials, different constituent atomic percentages, and/or different constituent weight percentages) to achieve etching selectivity. During a gate replacement process to form the gate stack 240, the sacrificial semiconductor layers are removed, leaving the channel layers 215 suspended over the semiconductor fins 204.

In some embodiments, the inner spacer layer 255 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacer layer 255 includes a low-k dielectric material, such as those described herein. The inner spacer layer 255 may be formed by deposition and etching processes. For example, after S/D trenches are etched and before the S/D features 260 are epitaxially grown from the S/D trenches, an etch process may be used to recess the sacrificial semiconductor layers between the adjacent channel layers 215 to form gaps vertically between the adjacent channel layers 215. Then, one or more dielectric materials are deposited (using CVD or ALD for example) to fill the gaps. Another etching process is performed to remove the dielectric materials outside the gaps, thereby forming the inner spacer layer 255.

In some embodiments, the dielectric blocking layer 203 includes a low-k dielectric material such as a dielectric material including Si, O, N, and C, other suitable material, or combinations thereof (for example, silicon oxide, silicon nitride, silicon oxynitride, silicon carbide, or silicon oxycarbonitride). In some embodiment, the dielectric blocking layer 203 may include materials such as $La_2O_3$, $Al_2O_3$, SiOCN, SiOC, SiCN, $SiO_2$, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The dielectric blocking layer 203 may be deposited using CVD, ALD, PVD, or oxidation. In an embodiment, the dielectric blocking layer 203 is initially deposited on the semiconductor fin 204 and is patterned using the same process that patterns the semiconductor fin 204. In another embodiment, a sacrificial semiconductor layer (such as SiGe) is initially deposited on the semiconductor fin 204 and is patterned using the same process that patterns the semiconductor fin 204. The sacrificial layer is removed and replaced with the dielectric blocking layer 203 during a gate replacement process that forms the gate stack 240. The dielectric blocking layer 203 serves to isolate the channel layers 215 and the gate stack 240 from the backside vias to be formed in subsequent processes. In some embodiments, the dielectric blocking layer 203 may have a thickness d5 in a range of 3 nm to about 30 nm. In some embodiment, if the dielectric blocking layer 203 is too thin (such as less than 3 nm), then it may not provide sufficient isolation to the channel layers 215 and the gate stack 240. In some embodiment, if the dielectric blocking layer 203 is too thick (such as more than 50 nm), then the backside vias would be long and the resistance thereof would be high, which will be further discussed later.

In the depicted embodiment, each gate stack 240 includes a gate dielectric layer 349 and a gate electrode 350. The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 349 may be formed by chemical oxidation, thermal oxidation, atomic layer deposition (ALD), chemical vapor deposition (CVD), and/or other suitable methods. In some embodiments, the gate stack 240 further includes an interfacial layer between the gate dielectric layer 349 and the channel layers 215. The interfacial layer may include silicon dioxide, silicon oxynitride, or other suitable materials. In some embodiments, the gate electrode layer 350 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240 includes a high-k dielectric layer and metal layer(s), it is also referred to as a high-k metal gate.

In an embodiment, the gate spacer 247 includes a dielectric material such as a dielectric material including silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In embodiments, the gate spacer 247 may include $La_2O_3$, $Al_2O_3$, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). For example, a dielectric layer including silicon and nitrogen, such as a silicon nitride layer, can be deposited over a dummy gate stack (which is subsequently replaced by the high-k metal gate 240) and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate stack 240. In embodiments, the gate spacer 247 may have a thickness of about 1 nm to about 40 nm, for example.

In some embodiments, the SAC layer 352 includes $La_2O_3$, $Al_2O_3$, SiOCN, SiOC, SiCN, $SiO_2$, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The SAC layer 352 protects the gate stacks 240 from etching and CMP processes that are used for etching S/D contact holes. The SAC layer 352 may be formed by recessing the gate stacks 240 and optionally recessing the gate spacers 247, depositing one or more dielectric materials over the recessed gate stacks 240 and optionally over the recessed gate spacers 247, and performing a CMP process to the one or more dielectric materials.

In embodiments, the CESLs 269 and 269' may each include $La_2O_3$, $Al_2O_3$, SiOCN, SiOC, SiCN, $SiO_2$, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layers 270 and 270' may each comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layers 270 and 270' may each be formed by PECVD (plasma enhanced CVD), FCVD (flowable CVD), or other suitable methods.

In some embodiments, the silicide features 273 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

In an embodiment, the S/D contacts 275 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contacts 275.

In some embodiments, the capping layer 356 includes $La_2O_3$, $Al_2O_3$, SiOCN, SiOC, SiCN, $SiO_2$, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The capping layer 356 protects the S/D contacts 275 from etching and CMP processes and isolating the S/D contacts 275 from the interconnect structure formed thereon. In some embodiments, the SAC layer 352 and the capping layer 356 include different materials to achieve etch selectivity, for example, during the formation of the capping layer 356.

In an embodiment, the S/D contact vias 358 and the gate vias 359 may each include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contact vias 358 and/or the gate vias 359. In some embodiments, the glue layer 357 may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD.

Figure 9A:
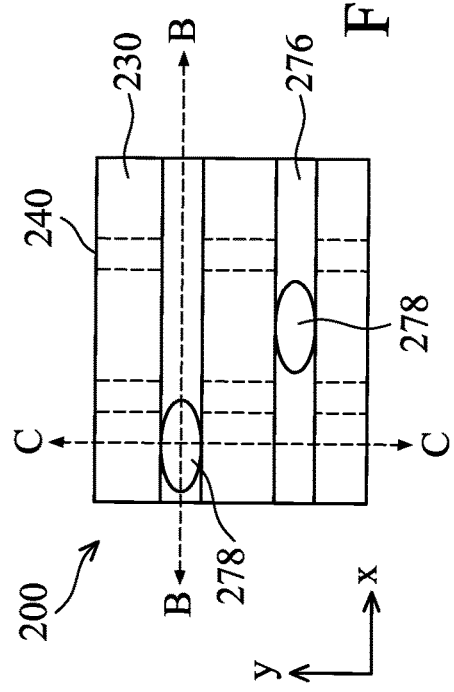
Figure 9B:
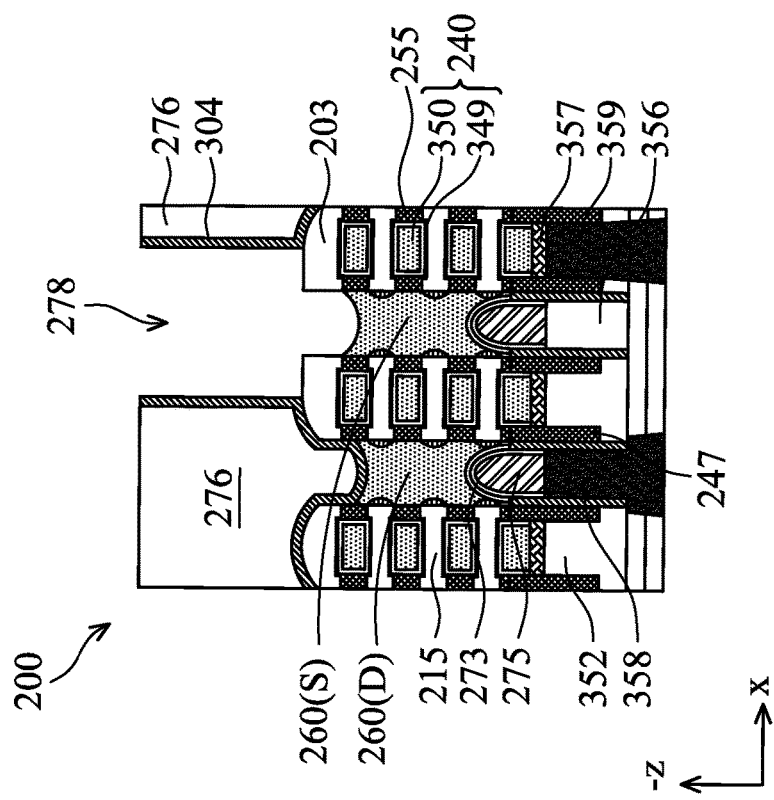
Figure 9C:
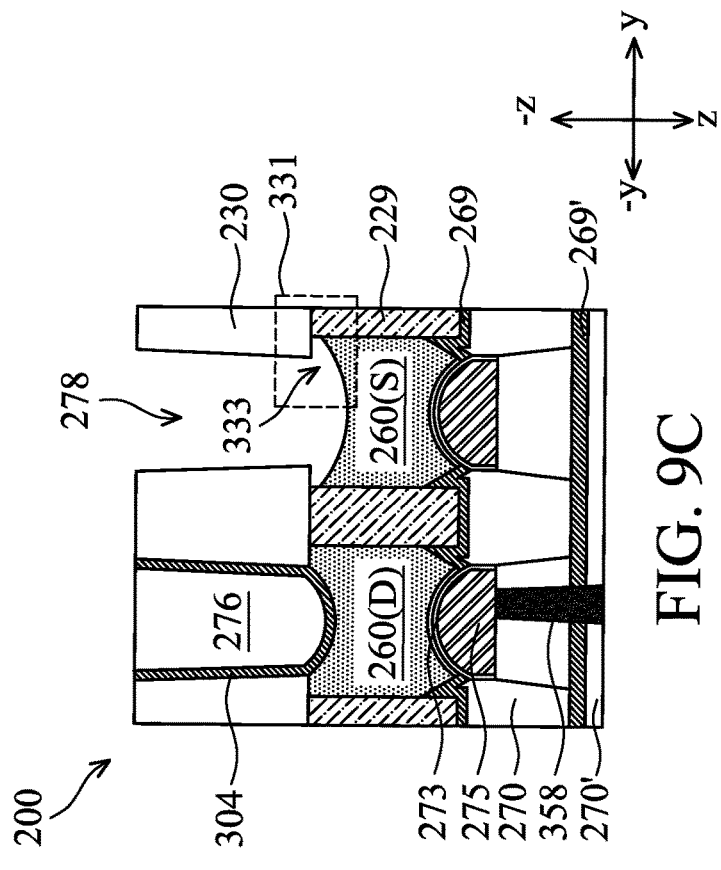
Figure 10A:
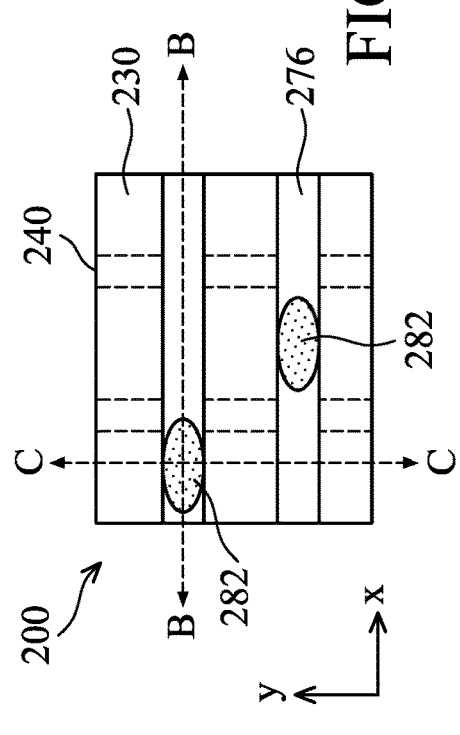
Figure 10B:
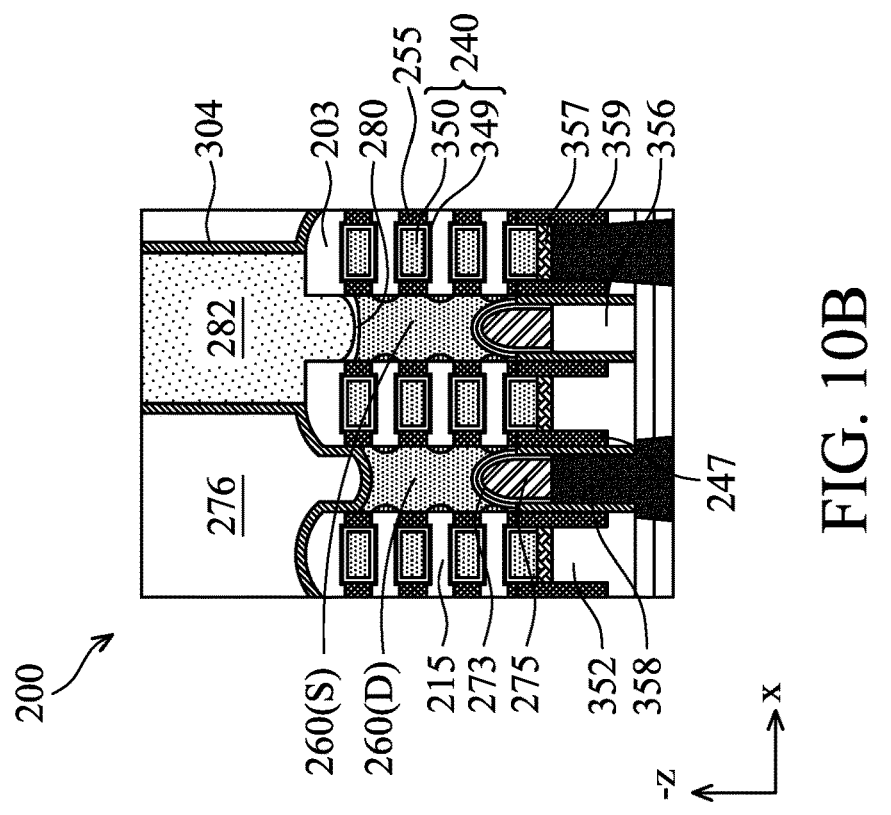
Figure 10C:
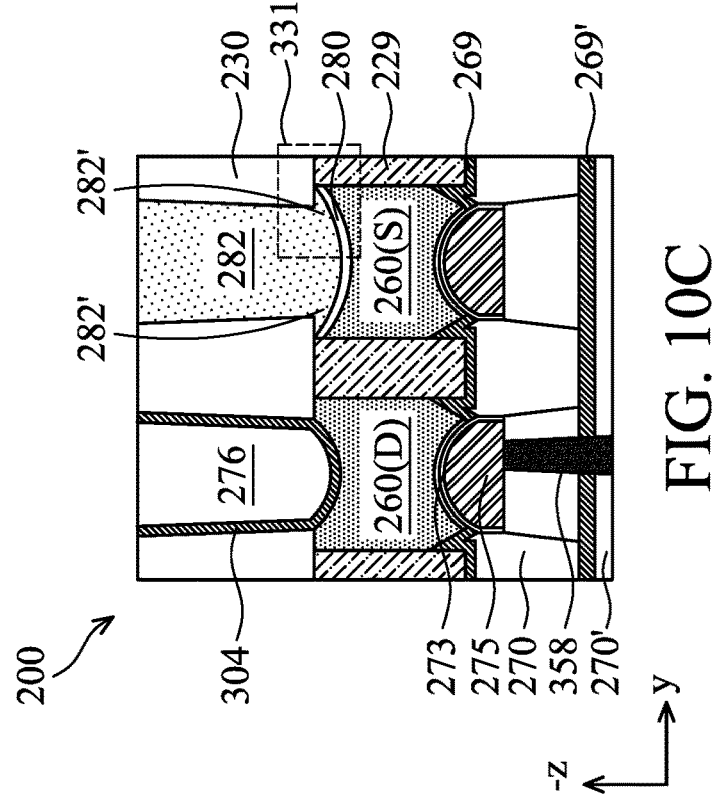
Figures 2, 10C:
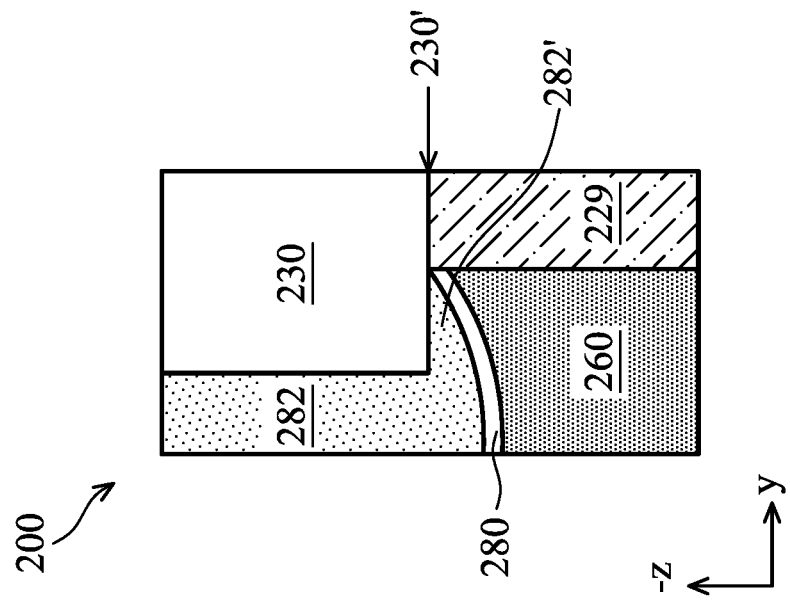
Figures 1, 10C:
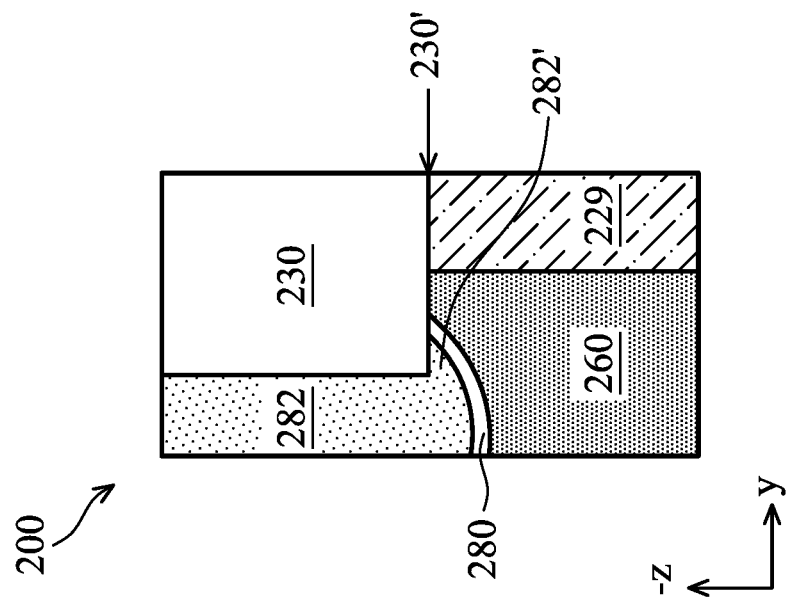
Figures 4, 10C:
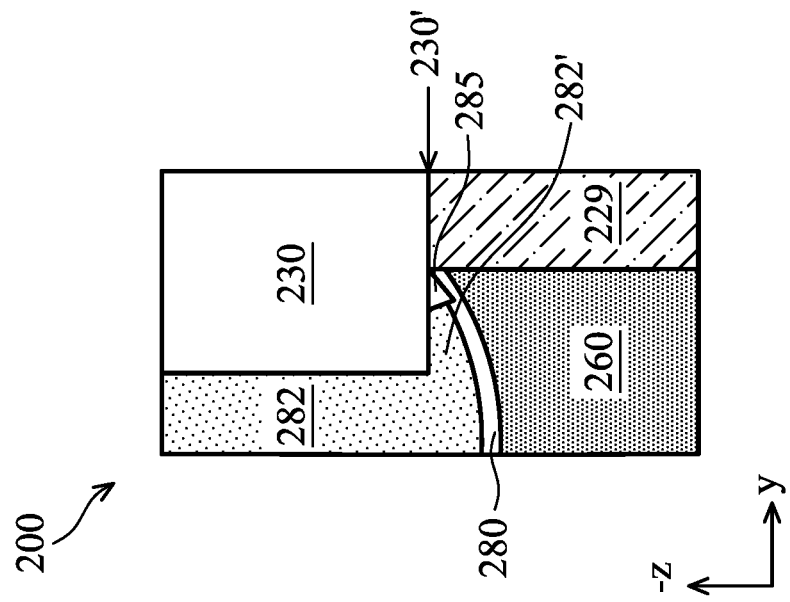
Figures 3, 10C:
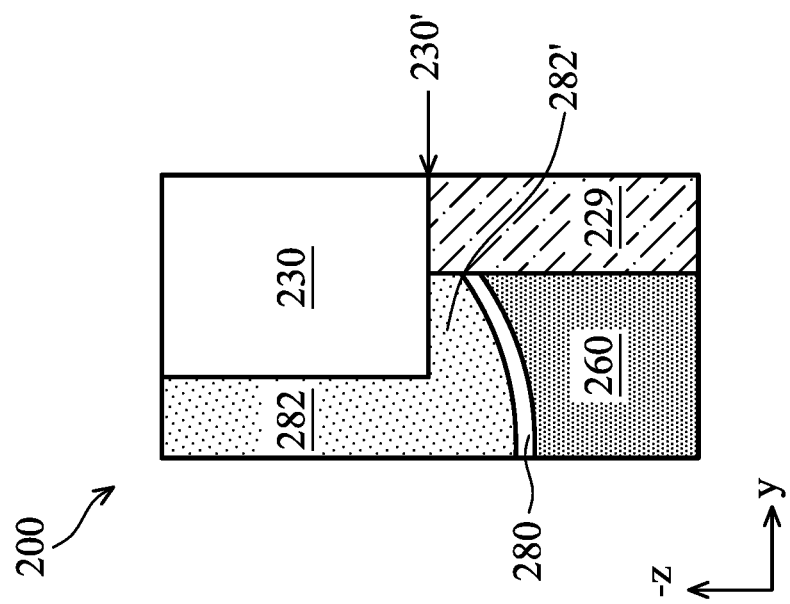

At operation 104, the method 100 (FIG. 1A) flips the device 200 upside down and attaches the frontside of the device 200 to a carrier 370, such as shown in FIGS. 3B and 3C. This makes the device 200 accessible from its backside for further processing. The operation 104 may use any suitable attaching processes, such as direct bonding, hybrid bonding, using adhesive, or other bonding methods. The operation 104 may further include alignment, annealing, and/or other processes. The carrier 370 may be a silicon wafer in some embodiment. In FIGS. 2A-11C, the "z" direction points from the backside of the device 200 to the frontside of the device 200, while the "−z" direction points from the frontside of the device 200 to the backside of the device 200.

At operation 106, the method 100 (FIG. 1A) thins down the device 200 from its backside until the semiconductor fins 204 and the isolation features 230 are exposed from the backside of the device 200. The resultant structure is shown in FIGS. 4A-4C according to an embodiment. For simplicity, FIGS. 4B through 11C omit some features that are already shown in FIGS. 3B-3C, particularly the layer 277 and the carrier 370. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201.

At operation 108, the method 100 (FIG. 1A) forms a patterned etch mask 360 over the backside of the device 200. The etch mask 360 covers the area under the S/D features 260 that are to be connected to backside vias and exposes the other area with openings 362. The resultant structure is shown in FIGS. 5A-5C according to an embodiment. In the depicted embodiment, the etch mask 360 covers the backside of source features (such as 260(S)) and exposes the backside of drain features (such as 260(D)). In some alternative embodiments, the etch mask 360 covers the backside of drain features (such as 260(D)) and exposes the backside of source features (such as 260(S)). In some other alternative embodiments, the etch mask 360 covers the backside of some of the source features and drain features and exposes other source features and drain features. The etch mask 360 includes a material that is different than a material of the semiconductor fins 204 to achieve etching selectivity. In the depicted embodiment, the etch mask 360 includes a patterned resist 363 over a patterned hard mask 361 (such as a patterned mask having silicon nitride). In some embodiments, the etch mask 360 further includes an anti-reflective coating (ARC) layer or other layer(s) between the patterned resist 363 and the hard mask 361. The present disclosure contemplates other materials for the etch mask 360, so long as etching selectivity is achieved during the etching of the semiconductor fins 204. In some embodiments, after depositing a hard mask layer (e.g., a silicon nitride layer) over the backside of the device 200 (for example, using CVD, ALD, PVD, or other methods), operation 108 performs a lithography process that includes forming a resist layer over the hard mask layer (e.g., by spin coating), performing a pre-exposure baking process, performing an exposure process using a mask, performing a post-exposure baking process, and performing a developing process. During the exposure process, the resist layer is exposed to radiation energy (e.g., UV light, DUV light, or EUV light), where the mask blocks, transmits, and/or reflects radiation to the resist layer depending on a mask pattern of the mask and/or mask type (e.g., binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the resist layer is patterned into the resist pattern 363 that corresponds with the mask. Alternatively, the exposure process can be implemented or replaced by other methods, such as maskless lithography, e-beam writing, ion-beam writing, or combinations thereof. The hard mask layer is then etched through the patterned resist 363 to result in the patterned hard mask 361.

Figure 6B:
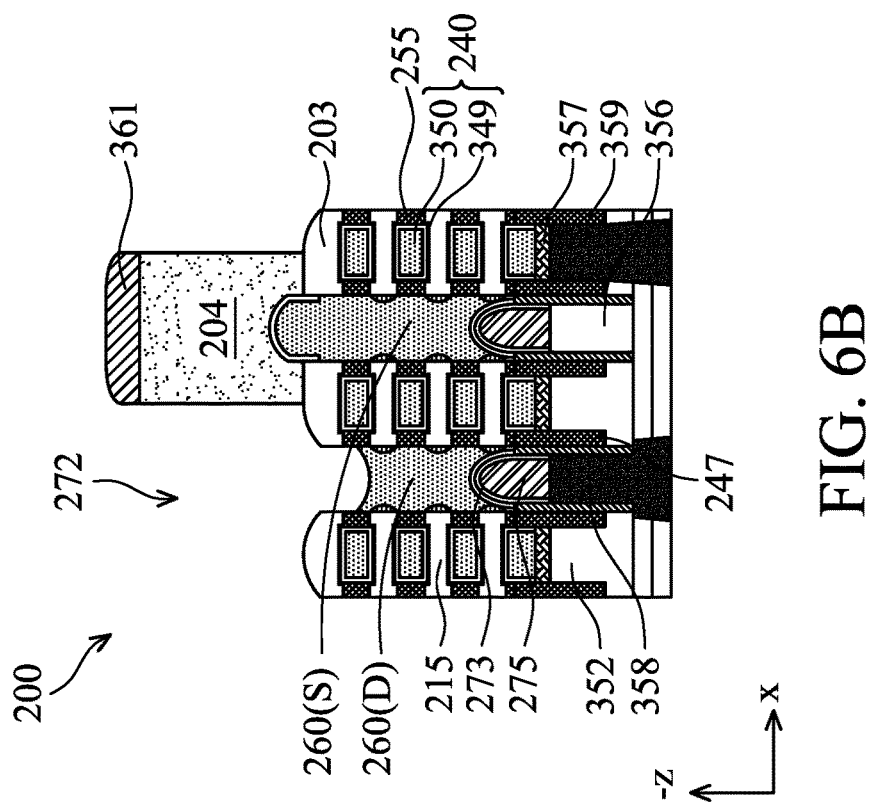
Figure 6A:
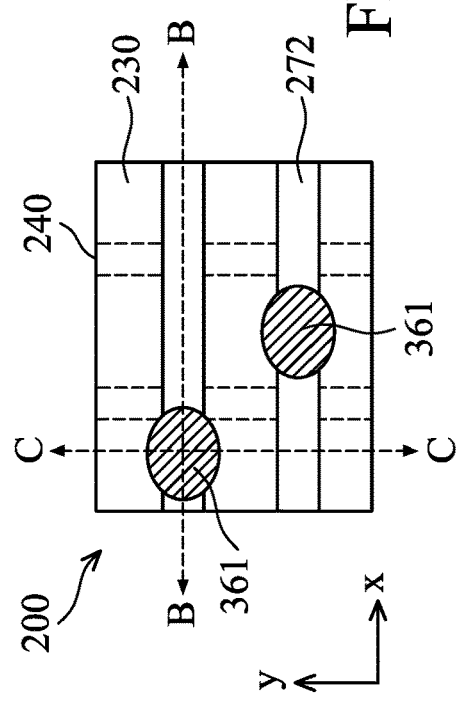
Figure 6C:
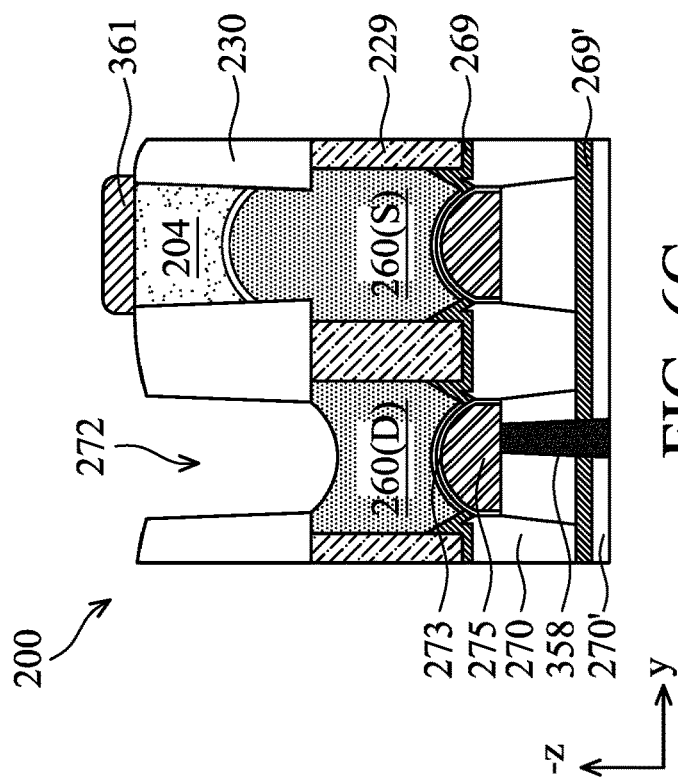

At operation 110, the method 100 (FIG. 1A) selectively etches the semiconductor fins 204 through the etch mask 360 to form trenches 272 over the backside of the gate stacks 240 and some of the S/D features 260, including the drain feature 260(D) in the embodiment shown in FIGS. 6A-6C. The patterned resist 363 is removed during or after the etching process completes. The patterned hard mask 361 may be partially consumed during the etching process. In the present embodiment, the operation 110 applies an etching process that is tuned to be selective to the materials of the semiconductor fins 204 and with no (or minimal) etching to the isolation features 230, the blocking layer 203, and the inner spacers 255. In the present embodiment, the etching process also etches the drain features 260(D) to recess it to a level that is even with or below the interface between the isolation structure 230 and the dielectric fins 229. The blocking layer 203 and the inner spacers 255 protect the gate stacks 240 from this etching process and could be partially consumed in some embodiments. In some embodiments, the operation 110 may apply more than one etching processes. For example, it may apply a first etching process to selectively remove the exposed portions of the semiconductor fins 204, and then apply a second etching process to selectively recess the S/D features 260 to a desired level, where the first and the second etching processes use different etching parameters such as using different etchants depending on the materials in the semiconductor fins 204 and the S/D features 260. The etching process(es) can be dry etching, wet etching, reactive ion etching, or other etching methods.

At operation 112, the method 100 (FIG. 1A) forms one or more dielectric layers filling the trenches 272, such as depicted in FIGS. 7A-7C according to an embodiment. In the present embodiment, the operation 112 deposits a dielectric liner layer 304 on the backside of the structure 200 and deposits a dielectric fill layer (or a dielectric filler) 276 over the dielectric liner layer 304 and filling the trenches 272. In an embodiment, the dielectric liner layer 304 is deposited to a substantially uniform thickness along the various surfaces of the blocking layer 203, the isolation features 230, the inner spacers 255, and any remaining portions of the hard mask pattern 361. In some embodiments, the dielectric liner layer 304 includes a dielectric material such as a dielectric material including silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the dielectric liner layer 304 may include $La_2O_3$, $Al_2O_3$, SiOCN, SiOC, SiCN, $SiO_2$, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The dielectric liner layer 304 may be deposited using ALD, CVD, or other suitable methods. In some embodiments, the dielectric liner layer 304 is optional for the device 200 and can be omitted. The dielectric filler 276 may include a low-k dielectric material such as a dielectric material including Si, O, N, and C, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SILK (Dow Chemical, Midland, Michigan), polyimide, or combinations thereof. The dielectric filler 276 may be deposited using CVD, FCVD, PVD, ALD, HDPCVD, MOCVD, RPCVD, PECVD, LPCVD, ALCVD, APCVD, other suitable methods, or combinations thereof.

At operation 114, the method 100 (FIG. 1B) performs a CMP process to the dielectric filler 276, the dielectric liner 304, and the patterned hard mask 361 to remove them from the bottom (or backside) surface of the isolation features 230 and the semiconductor fins 204. Referring to FIGS. 8A-8C, the semiconductor fins 204 are exposed from the backside of the device 200 for further processing.

At operation 116, the method 100 (FIG. 1B) removes the semiconductor fins 204 and recesses some of the S/D features 260 (including the source feature 260(S) in the present embodiment), resulting in via holes 278. The resultant structure is shown in FIGS. 9A-9C according to an embodiment. FIGS. 9C-1, 9C-2, and 9C-3 illustrate blown-up views of a portion of the device 200 in the dashed box 331 of FIG. 9C according to various embodiments. In the present embodiment, a via hole 278 exposes the source feature 260(S) (specifically, the bottom (or backside) surface of the source feature 260(S)) from the backside of the device 200. In the "y-z" cross-sectional view (FIG. 9C), the via hole 278 includes a pair of gaps 333 that extends laterally (along the "y" direction) between the isolation features 230 and the source feature 260(S). This beneficially increases the surface of the source feature 260(S) exposed in the via hole 278 for reducing source contact resistance with via 282 (see FIG. 10C). As shown in FIGS. 9C-1, 9C-2, and 9C-3, the bottom surface of the source feature 260(S) is recessed to a level below the top surface 230' of the isolation features 230 by a distance d1 (along the "z" direction), which is also the depth of the gap 333. The distance d1 is greater than 0 nm. In some embodiments, the distance d1 is greater than 0.5 nm. Otherwise it might be difficult for backside vias 282 and silicide feature 280 (FIG. 10C) to fill in the gaps 333. In some embodiments, the distance d1 is less than or equal to 20 nm so that a sufficient volume of the source feature 260(S) is preserved for device performance considerations. In the above discussion, the top surface 230' of the isolation features 230 is the surface that the dielectric fins 229 are disposed on. As further shown in FIGS. 9C-1, 9C-2, and 9C-3, the gaps 333 extend laterally (along the "y" direction) beyond the sidewalls of the isolation features 230 by a distance d2. The distance d2 is greater than 0 nm to beneficially increase the exposed bottom surface of the source feature 260(S) for reduced source contact resistance. In some embodiments, the distance d2 may be up to 20 nm. In some embodiments, the gap 333 does not reach the dielectric fins 229 such as shown in FIG. 9C-1. In other words, a portion of the source feature 260(S) is disposed between the gap 333 and the dielectric fins 229. In some embodiments, the distance d2 may be large enough to reach the corner where the dielectric fins 229 meet the isolation features 230, such as shown in FIG. 9C-2. Still further, in some embodiments, the distance d2 may be large enough so that a portion of the dielectric fins 229 is exposed in the gap 333, such as shown in FIG. 9C-3. The depth d1 and the extension d2 may be designed based on objectives such as a desired volume of the remainder of the source feature 260(S), whether a silicide feature is to be formed on the exposed bottom surface of the source feature 260(S), the material of the silicide feature, and the thickness of the silicide feature. In the present embodiment, the gaps 333 are formed deep enough and wide enough so that they are not completely filled by a silicide feature (if present) and that a via (such as the via 282) is ensured to extend vertically between the isolation features 230 and the source feature 260(S). Still further, as shown in FIGS. 9C-1, 9C-2, and 9C-3, each of the gaps 333 becomes narrower as it approaches the sidewall of the source feature 260(S). In other words, each of the gaps 333 becomes narrower as it is closer to the dielectric fins 229 along the "y" direction. As will be discussed, such profile is created by applying an isotropic etching to the source feature 260(S). Such profile allows metals (including metal(s) for forming a silicide feature and metal(s) for forming a via) to more easily fill in the gaps 333 and prevents voids in the via structure. This beneficially reduces via resistance and improves device reliability. In the "x-z" cross-sectional view (FIG. 9B), the via hole 278 is confined between portions of the dielectric filler 276 (and the dielectric liner 304 if present) and the blocking layer 203. The via hole 278 may expose some portion of the inner spacers 255 in some embodiments but does not expose any of the gate stacks 240 and the channel layers 215. Notably, the gaps 333 do not appear in the "x-z" cross-sectional view (FIG. 9B).

In an embodiment, to achieve the profile of the via hole 278 as discussed above, the operation 116 applies one or more etching processes to the device 200 where at least one of the etching processes is an isotropic etching directed to the source feature 260(S). For example, it may apply an isotropic etching process to remove the semiconductor fins 204, recess the source feature 260(S), and create the gaps 333 by one fabrication step. This is desirable for simplifying the fabrication process. In embodiments where the semiconductor fins 204 includes silicon and the source feature 260(S) includes silicon or silicon germanium, the operation 116 may apply an isotropic plasma etching using plasma generated from a fluorine-containing gas and ammonia to achieve the above purpose. Further, the etching is tuned to selectively etch the materials of the semiconductor fins 204 and the source feature 260(S), and with no (or minimal) etching to the isolation features 230, the dielectric filler 276, the dielectric liner 304 (if present), the blocking layer 203, and the inner spacers 255.

For another example, the operation 116 may apply a first etching process (which can be anisotropic or isotropic) to selectively remove the semiconductor fins 204, and then apply a second etching process (which is an isotropic etching) to selectively recess the source feature 260(S) to a desired level and to create the gaps 333. The first and the second etching processes may use different etching parameters such as using different etchants depending on the materials in the semiconductor fins 204 and the source feature 260(S), which materials have been discussed above with reference to FIGS. 2A and 2B. The etching process(es) can be dry etching, wet etching, reactive ion etching, or other etching methods and are tuned to selective etch the materials of the semiconductor fins 204 and the source feature 260(S) (as discussed above), and with no (or minimal) etching to the isolation features 230, the dielectric filler 276, the dielectric liner 304 (if present), the blocking layer 203, and the inner spacers 255. The present disclosure contemplates using any suitable etching process(es) to achieve the profile of the via hole 278 as discussed above.

At operation 118, the method 100 (FIG. 1B) forms a silicide feature 280 and a via structure (or a via) 282 in the via hole 278, such as shown in FIGS. 10A-10D. FIGS. 10C-1, 10C-2, 10C-3, and 10C-4 illustrate blown-up views of a portion of the device 200 in the dashed box 331 of FIG. 10C according to various embodiments. The structures shown in FIGS. 10C-1, 10C-2, and 10C-3 correspond to the structures shown in FIGS. 9C-1, 9C-2, and 9C-3, with the addition of the silicide feature 280 and the via 282. As shown in FIGS. 10C, 10C-1, 10C-2, and 10C-3, in the present embodiment, the silicide feature 280 only partially fills the gaps 333, while the via 282 fills the remaining portion of the gaps 333. Having the gaps 333 advantageously increases the surface area of the silicide feature 280, increase the contact area between the via 282 and the silicide feature 280, and decreases the contact resistance. In the embodiment shown in FIG. 10C-1, neither the silicide feature 280 nor the via structure 282 physically contacts the dielectric fins 229. In the embodiment shown in FIG. 10C-2, the silicide feature 280 physically contacts the dielectric fins 229 but the via structure 282 does not physically contact the dielectric fins 229. In the embodiment shown in FIG. 10C-3, both the silicide feature 280 and the via structure 282 physically contact the dielectric fins 229. In some embodiments, depending on the size of the gap 333 and the filling capability of the metal(s) for the via 282, the silicide feature 280 and the via 282 may not completely fill the gap 333, leaving an air void 285 trapped by the isolation feature 230, the dielectric fins 229, the S/D feature 260, the silicide feature 280, and the via 282, such as shown in FIG. 10C-4. The air void 285 somewhat reduces the coupling capacitance between the via 282 and the nearby conductors such as metal gates 240 at the expense of reduced contact area between the via 282 and the S/D feature 260.

As shown in FIG. 10C, the via 282 has two ends 282' that extend vertically (along the "z" direction) between the isolation features 230 and the source feature 260(S). Since the shape of the via 282 resembles a boat anchor, it is referred to as anchor-shaped via 282 and the ends 282' are referred to as anchor ends 282'. As shown in FIGS. 10C-1, 10C-2, and 10C-3, each of the anchor ends 282' becomes narrower as it approaches the sidewall of the source feature 260(S). In other words, each of the anchor ends 282' becomes narrower (along the "z" direction) as it gets closer to the dielectric fins 229 along the "y" direction. Also, there is no dielectric liner (such as a liner having silicon nitride) between the via 282 and the isolation features 230 in the "y-z" cross-sectional view. This further increases the volume of the via 282 for reduced resistance. In the "x-z" cross-sectional view (FIG. 10B), the silicide feature 280 and the via 282 are confined between portions of the dielectric filler 276 (and the dielectric liner 304 if present), the blocking layer 203, and the inner spacers 255.

Figure 10D:
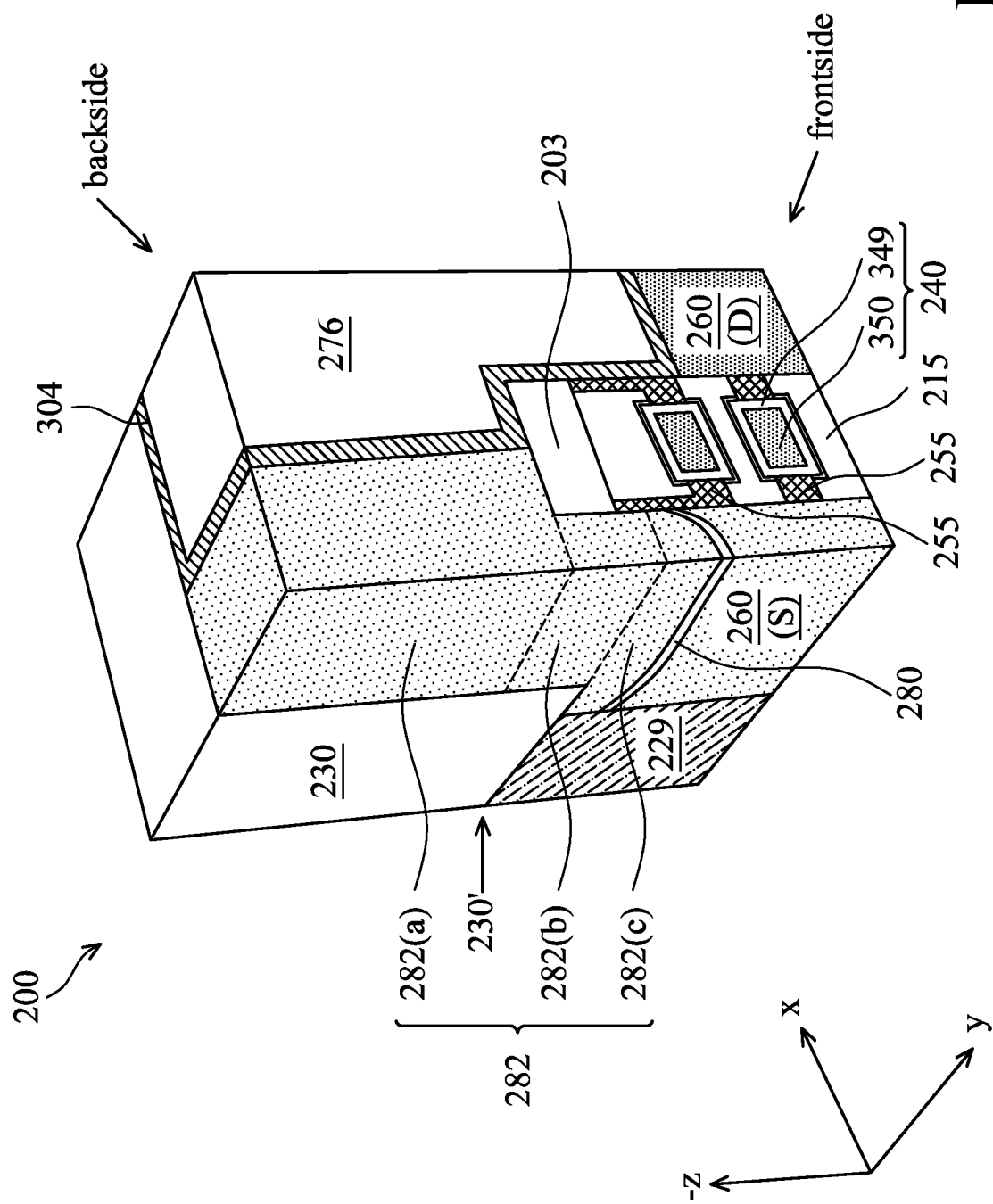
FIG. 10D illustrates a perspective view of a portion of the semiconductor device in FIG. 10A, according to an embodiment.

FIG. 10D illustrates a perspective view of the device 200, in portion, according to an embodiment. In the embodiment depicted in FIG. 10D, the via 282 includes three sections 282(a), 282(b), and 282(c). The section 282(a) is between the bottom surface of the isolation feature 230 (as well as the bottom surface of the dielectric filler 276) and the bottom surface of the blocking layer 203. The section 282(b) is between the bottom surface of the blocking layer 203 and the top surface 230' of the isolation feature 230. The section 282(c) is between the top surface 230' of the isolation feature 230 and the bottom surface of the source feature 260(S). In the "x-z" plane, the sections 282(b) and 282(c) are narrower than the section 282(a) along the "x" direction due to the presence of the blocking layer 203 and the inner spacers 255. In an embodiment, the sections 282(b) and 282(c) have about the same width along the "x" direction in the "x-z" plane (see also FIG. 10B). In the "y-z" plane, the 282(c) is wider than the section 282(b) along the "y" direction due to the presence of the gaps 333 (see also 10C). In some embodiments, the 282(c) is also wider than the section 282(a) along the "y" direction in the "y-z" plane (see also FIG. 10C). Therefore, the anchor-shaped via 282 provides an enlarged interfacial area with the source feature 260(S)

for reducing contact resistance thereof. Further, the surface of the section 282(c) is curvy for further increasing the interfacial area.

In an embodiment, the operation 118 includes depositing one or more metals into the via hole 278 (including filling into the gaps 333), performing an annealing process to the device 200 to cause reaction between the one or more metals and the source feature 260(S) to produce the silicide feature 280, and removing un-reacted portions of the one or more metals, leaving the silicide feature 280 in the via hole 278. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide feature 280 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

After forming the silicide feature 280, the operation 118 forms the via 282 over the silicide feature 280. In an embodiment, the via 282 may include tungsten (W), cobalt (Co), molybdenum (Mo), ruthenium (Ru), copper (Cu), nickel (Ni), titanium (Ti), tantalum (Ta), aluminum (Al), titanium nitride (TiN), tantalum nitride (TaN), or other metals, and may be formed by CVD, PVD, ALD, plating, or other suitable processes. The via 282 may include more than one layers of materials in some embodiments. For example, the via 282 may include a barrier layer on the surfaces of the via hole 278 and one or more low-resistance metals on the barrier layer. The barrier layer may include titanium (Ti), tantalum (Ta), titanium nitride (TiN), tantalum nitride (TaN), tungsten (W), cobalt (Co), ruthenium (Ru), or other suitable material, and the low-resistance metals may include tungsten (W), cobalt (Co), molybdenum (Mo), ruthenium (Ru), aluminum (Al), or other metals. The operation 118 may perform a CMP process to remove excessive materials of the via 282.

Figure 11A:
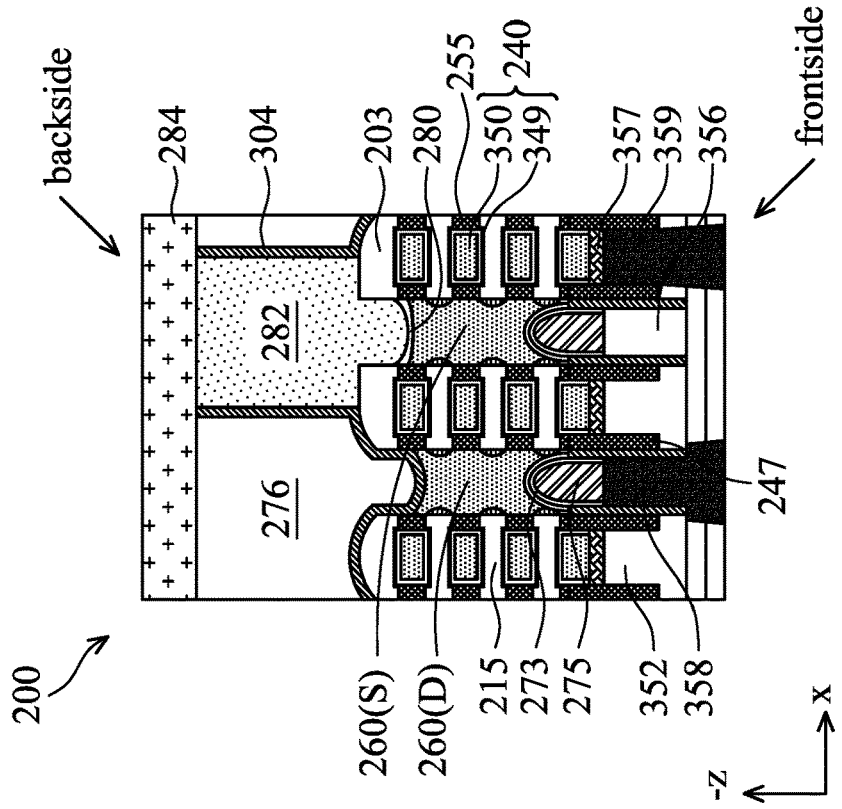
Figure 11C:
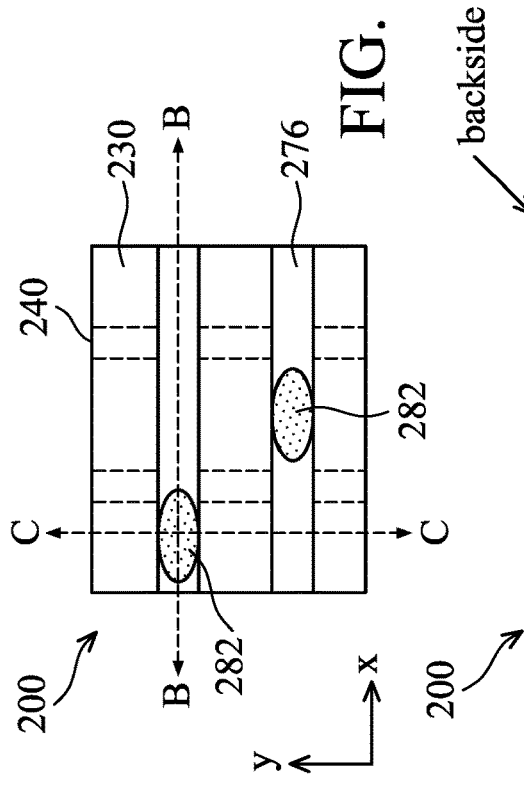
Figure 11B:
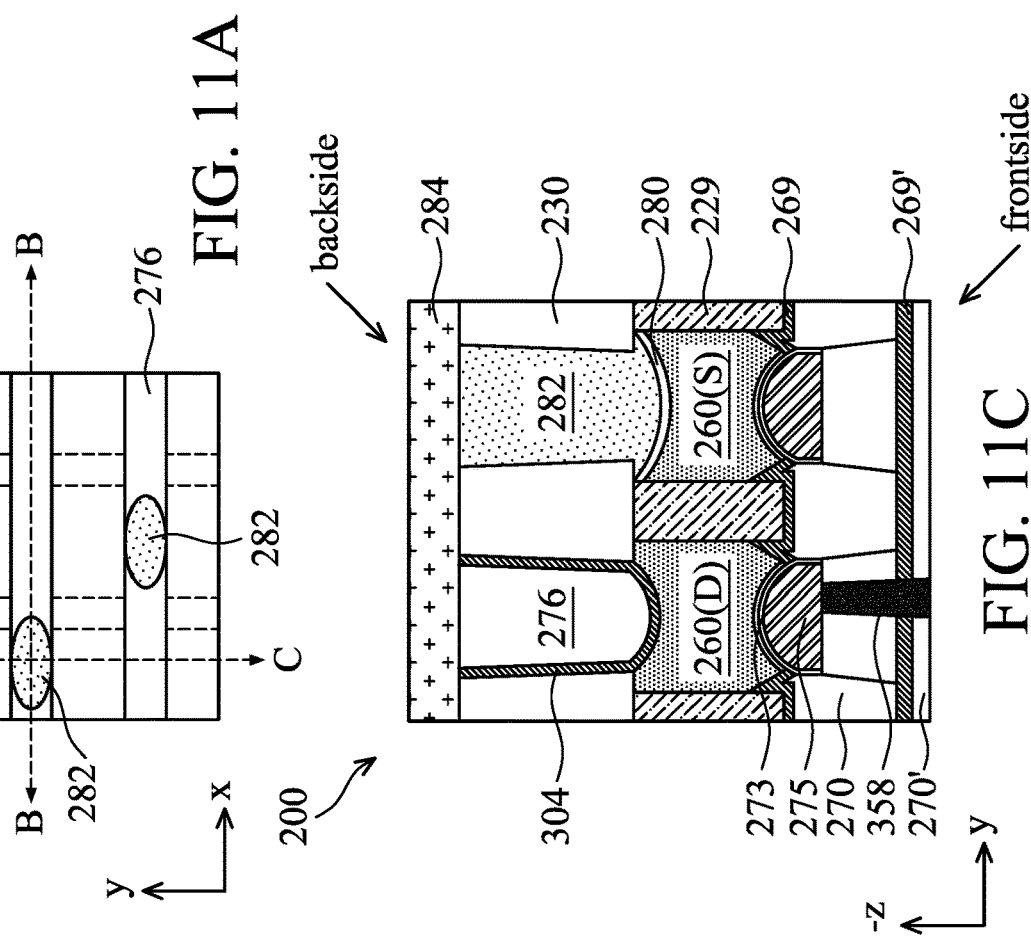

At operation 120, the method 100 (FIG. 1B) forms one or more backside power rails 284. The resultant structure is shown in FIGS. 11A-11C according to an embodiment. As illustrated in FIGS. 11B-11C, the backside via 282 is electrically connected to the backside power rails 284. In an embodiment, the backside power rails 284 may be formed using a damascene process, a dual-damascene process, a metal patterning process, or other suitable processes. The backside power rails 284 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. Although not shown in FIGS. 11A-11C, the backside power rails 284 are embedded in one or more dielectric layers. Having backside power rails 284 beneficially increases the number of metal tracks available in the device 200 for directly connecting to source/drain contacts and vias. It also increases the gate density for greater device integration than other structures without the backside power rails 284. The backside power rails 284 may have wider dimension than the first level metal (M0) tracks on the frontside of the device 200, which beneficially reduces the backside power rail resistance.

At operation 122, the method 100 (FIG. 1B) performs further fabrication processes to the device 200. For example, it may form one or more interconnect layers on the backside of the structure 200, form passivation layers on the backside of the device 200, perform other BEOL processes, and remove the carrier 370.

Although not intended to be limiting, embodiments of the present disclosure provide one or more of the following advantages. For example, embodiments of the present disclosure use isotropic etching methods to laterally extend a via opening between an S/D feature and an isolation feature to thereby increase an interfacial area between the S/D feature and a backside via. This advantageously reduces the backside contact resistance. Embodiments of the present disclosure can be readily integrated into existing semiconductor manufacturing processes.

In one example aspect, the present disclosure is directed to a method that includes providing a structure including a fin, an isolation structure adjacent to sidewalls of the fin, and first and second source/drain (S/D) features over the fin. The method further includes forming an etch mask covering a first portion of the fin under the first S/D feature and exposing a second portion of the fin under the second S/D feature; removing the second portion of the fin, resulting in a first trench; filling the first trench with a first dielectric feature; removing the etch mask; and applying one or more etching processes to remove the first portion of the fin and to partially recess the first S/D feature. The one or more etching processes include an isotropic etching tuned selective to materials of the first S/D feature and not materials of the isolation structure and the first dielectric feature, resulting in a second trench under the first S/D feature and having a gap vertically between a bottom surface of the first S/D feature and a top surface of the isolation structure. The method further includes forming a via structure in the second trench.

In an embodiment of the method, a vertical dimension of the gap becomes smaller as the gap extends towards a sidewall of the first S/D feature in a cross-section perpendicular to a direction from the first S/D feature to the second S/D feature. In another embodiment, the structure further includes two dielectric fins sandwiching the first S/D feature, and the gap exposes a side surface of the dielectric fins.

In some embodiment of the method, the first S/D feature comprises silicon or silicon germanium, the isolation structure comprises silicon oxide, the first dielectric feature comprises silicon nitride, and the isotropic etching uses plasma generated from a fluorine-containing gas and ammonia.

In some embodiment, before the forming of the via structure, the method further includes forming a silicide feature on the bottom surface of the first S/D feature, wherein the via structure is formed on the silicide feature. In some embodiment where the structure further includes a substrate under the fin, the method further includes thinning down the substrate until the fin is exposed before the forming of the etch mask.

In some embodiment of the method, in a cross-section perpendicular to a direction from the first S/D feature to the second S/D feature, a first portion of the via structure proximal the first S/D feature is wider than a second portion of the via structure distal the first S/D feature. In a further embodiment, in another cross-section parallel to the direction from the first S/D feature to the second S/D feature, the first portion of the via structure is narrower than the second portion of the via structure. In some embodiment of the method, filling the first trench with the first dielectric feature includes depositing a dielectric liner layer over surfaces of the first trench and filling a remaining portion of the first trench with another dielectric material.

In another example aspect, the present disclosure is directed to a method that includes providing a structure including a substrate, a fin over the substrate, an isolation structure over the substrate and adjacent to sidewalls of the fin, first and second source/drain (S/D) features over the fin, a dielectric cap over the fin and between the first and the second S/D features, a channel layer over the dielectric cap and connecting the first and the second S/D features, and a gate structure engaging the channel layer. The method further includes thinning down the substrate until the fin is exposed; forming an etch mask covering a first portion of the fin and exposing a second portion of the fin; removing the second portion of the fin, resulting in a first trench exposing the second S/D feature; filling the first trench with a first dielectric feature; and performing a chemical mechanical planarization (CMP) process to planarize the first dielectric feature and remove the etch mask. The method further includes removing the first portion of the fin and recessing the first S/D feature by one or more etching processes including an isotropic etching process, resulting in a second trench exposing the first S/D feature and having a gap vertically between a bottom surface of the first S/D feature and a top surface of the isolation structure. The isotropic etching process is tuned selective to materials of the fin and the first S/D feature and not materials of the isolation structure, the dielectric cap, and the first dielectric feature. The method further includes forming a via structure in the second trench and electrically connecting to the first S/D feature.

In an embodiment, before the forming of the via structure, the method further includes forming a silicide feature on the bottom surface of the first S/D feature, wherein the via structure is formed on the silicide feature. In some embodiments of the method, the fin comprises silicon, the first S/D feature comprises silicon or silicon germanium, and the isotropic etching process uses plasma generated from a fluorine-containing gas and ammonia.

In an embodiment of the method, a vertical dimension of the gap becomes smaller as the gap extends towards a sidewall of the first S/D feature in a cross-section perpendicular to a direction from the first S/D feature to the second S/D feature. In some embodiments of the method, the structure further includes two dielectric fins sandwiching the first S/D feature, and the gap exposes a side surface of the dielectric fins. In a further embodiment, the via structure physically contacts the side surface of the dielectric fins. In another embodiment, the method further includes forming a power rail under the via structure and electrically connecting to the via structure.

In yet another example aspect, the present disclosure is directed to a semiconductor structure that includes first and second source/drain (S/D) features; a dielectric cap between the first and the second S/D features; one or more channel layers over the dielectric cap and connecting the first and the second S/D features; a high-k metal gate over the dielectric cap and engaging the one or more channel layers; an isolation structure, wherein at least a portion of the isolation structure is under the first and the second S/D features; a power rail under the isolation structure; and a via structure extending through the portion of the isolation structure and electrically connecting the first S/D feature and the power rail. In a cross-section perpendicular to a direction from the first S/D feature to the second S/D feature, the via structure extends into space vertically between the first S/D feature and the isolation structure.

In an embodiment, the via structure has a shape of an anchor in the cross-section. In another embodiment, the semiconductor structure is free of a dielectric liner between the via structure and the isolation structure in the cross-section. In yet another embodiment, a vertical dimension of the via structure becomes smaller as the via structure extends towards a sidewall of the first S/D feature in the cross-section.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a source/drain (S/D) region;
   one or more dielectric layers over the S/D region;
   one or more semiconductor channel layers connected to the S/D region;
   an isolation structure under the S/D region and the one or more semiconductor channel layers; and
   a via under the S/D region and electrically connected to the S/D region, wherein a lower portion of the via is surrounded by the isolation structure, and an upper portion of the via extends vertically between the S/D region and the isolation structure, wherein in a cross-section that extends through the S/D region and perpendicular to a lengthwise direction of the one or more semiconductor channel layers, the via has a shape of an anchor.

2. The semiconductor structure of claim 1, further comprising a metallic contact on the S/D region and electrically connected to the S/D region.

3. The semiconductor structure of claim 1, further comprising a power rail under the isolation structure, wherein the via electrically connects the S/D region to the power rail.

4. The semiconductor structure of claim 1, wherein in the cross-section, a vertical dimension of the upper portion of the via becomes smaller as the upper portion of the via extends outwardly.

5. The semiconductor structure of claim 1, wherein the S/D region is a first S/D region, further comprising:
   a second S/D region adjacent the first S/D region; and
   a dielectric fin sandwiched between the first and the second S/D regions in the cross-section.

6. The semiconductor structure of claim 5, wherein the upper portion of the via directly contacts the dielectric fin.

7. The semiconductor structure of claim 5, further comprising:
   a dielectric structure under and extending into the second S/D region.

8. The semiconductor structure of claim 1, wherein in the cross-section, the upper portion of the via has a rounded top surface.

9. The semiconductor structure of claim 8, wherein in another cross-section that extends through the S/D region and parallel to the lengthwise direction of the one or more semiconductor channel layers, the upper portion of the via also has a rounded top surface.

10. A semiconductor structure, comprising:
first and second source/drain (S/D) regions;
a first dielectric layer over the first and the second S/D regions;
a semiconductor channel layer connected to the first S/D region;
a second dielectric layer sandwiched between the first and the second S/D regions in a cross-section that extends through the first S/D region and perpendicular to a lengthwise direction of the semiconductor channel layer;
an isolation structure under the first and the second S/D regions and the semiconductor channel layer; and
a via under the first S/D region and electrically connected to the first S/D region, wherein an upper portion of the via extends vertically between the first S/D region and the isolation structure in the cross-section.

11. The semiconductor structure of claim 10, wherein a lower portion of the via is sandwiched by the isolation structure in the cross-section.

12. The semiconductor structure of claim 11, wherein the lower portion of the via and the upper portion of the via form a shape of an anchor in the cross-section.

13. The semiconductor structure of claim 10, further comprising:
   a gate over the semiconductor channel layer; and
   a third dielectric layer vertically between the gate and the via.

14. The semiconductor structure of claim 10, wherein the upper portion of the via has a rounded top surface in the cross-section.

15. The semiconductor structure of claim 14, wherein in another cross-section that extends through the first S/D region and the semiconductor channel layer, the upper portion of the via also has a rounded top surface.

16. A semiconductor structure, comprising:
a source/drain (S/D) region;
a first dielectric layer over the S/D region;
a semiconductor channel layer connected to the S/D region;
a gate over the semiconductor channel layer;
an isolation structure under the S/D region, the semiconductor channel layer, and the gate;
a via under the S/D region, wherein an upper portion of the via extends vertically between the S/D region and the isolation structure;
a second dielectric layer vertically between the gate and a lower portion of the via;
a power rail under the isolation structure, wherein the via electrically connects the S/D region to the power rail; and
a dielectric fin on the isolation structure and adjacent the S/D region, wherein the upper portion of the via directly contacts the dielectric fin.

17. The semiconductor structure of claim 16, wherein the via has an anchor shape in a cross-section that extends through the S/D region and perpendicular to a lengthwise direction of the semiconductor channel layer.

18. The semiconductor structure of claim 16, wherein the via has a rounded top surface in a cross-section that extends through the S/D region and perpendicular to a lengthwise direction of the semiconductor channel layer.

19. The semiconductor structure of claim 16, wherein a vertical dimension of the upper portion of the via becomes smaller as the upper portion of the via extends outwardly.

20. The semiconductor structure of claim 16, further comprising:
   a source/drain contact over and electrically coupled to the source/drain (S/D) region; and
   a dielectric capping layer extending over the source/drain contact and disposed under the first dielectric layer.

* * * * *